US012704910B2

(12) United States Patent
Yamazaki et al.

(10) Patent No.: US 12,704,910 B2
(45) Date of Patent: Aug. 11, 2026

(54) DISPLAY SYSTEM, DISPLAY DEVICE, AND LIGHT-EMITTING APPARATUS

(71) Applicant: Semiconductor Energy Laboratory Co., Ltd., Kanagawa-ken (JP)

(72) Inventors: Shunpei Yamazaki, Tokyo (JP); Koji Kusunoki, Isehara (JP); Daisuke Kubota, Atsugi (JP); Kensuke Yoshizumi, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 19/009,098

(22) Filed: Jan. 3, 2025

(65) Prior Publication Data

US 2025/0138650 A1 May 1, 2025

Related U.S. Application Data

(63) Continuation of application No. 18/093,435, filed on Jan. 5, 2023, now Pat. No. 12,271,537, which is a
(Continued)

(30) Foreign Application Priority Data

Jan. 8, 2019 (JP) ................................ 2019-006581

(51) Int. Cl.
*G06F 3/0354* (2013.01)
*G09F 9/33* (2006.01)
(Continued)

(52) U.S. Cl.
CPC .......... *G06F 3/03542* (2013.01); *G09F 9/335* (2021.05); *G09G 3/3233* (2013.01);
(Continued)

(58) Field of Classification Search
CPC .. G06F 3/0304; G06F 3/03542; G06F 3/0412; G06F 3/042; G09F 9/00;
(Continued)

(56) References Cited

U.S. PATENT DOCUMENTS 6,303,943 B1 10/2001 Yu et al.
6,910,778 B2 6/2005 Hamana et al.
(Continued)

FOREIGN PATENT DOCUMENTS

CN 001295721 A 5/2001
CN 001922470 A 2/2007
(Continued)

OTHER PUBLICATIONS

International Search Report (Application No. PCT/IB2020/050067) Dated Mar. 24, 2020.
(Continued)

*Primary Examiner* — Stacy Khoo
(74) *Attorney, Agent, or Firm* — Husch Blackwell LLP

(57) ABSTRACT

A highly convenient display system is provided. A display system that enables a screen to be operated easily with a laser pointer is provided. A display system that enables a screen to be operated by a large number of people is provided. The display system includes a light-emitting apparatus and a display device. The light-emitting apparatus includes a means for emitting visible laser light and a means for emitting invisible light. The display device includes a display unit including a means for displaying an image and a means for obtaining positional information on a portion irradiated with the visible light, and a means for receiving the invisible light. The display system has a function of performing processing in accordance with the positional information when the invisible light is received.

7 Claims, 16 Drawing Sheets

Related U.S. Application Data continuation of application No. 17/422,891, filed as application No. PCT/IB2020/050067 on Jan. 7, 2020, now Pat. No. 11,550,407.

(51) Int. Cl.
*G09G 3/3233* (2016.01)
*H10K 59/12* (2023.01)
*H10K 65/00* (2023.01)
*H10K 59/80* (2023.01)

(52) U.S. Cl.
CPC ............. *H10K 59/12* (2023.02); *H10K 65/00* (2023.02); *G09G 2300/0426* (2013.01); *G09G 2300/0809* (2013.01); *G09G 2354/00* (2013.01); *H10K 59/8792* (2023.02)

(58) Field of Classification Search
CPC .. G09F 9/30; G09F 9/33; G09F 9/335; G09G 3/3233; G09G 2300/0426; G09G 2300/0809; G09G 2354/00; G09G 2360/148; H05B 33/12; H05B 33/26; H10K 59/12; H10K 59/60; H10K 65/00; H10K 59/8792
See application file for complete search history.

(56) References Cited

U.S. PATENT DOCUMENTS 7,166,966 B2 1/2007 Naugler, Jr. et al.
7,403,196 B2 7/2008 Hattori et al.
8,227,293 B2 7/2012 Bressers et al.
8,987,651 B2 3/2015 Kurokawa
9,155,498 B2 10/2015 Akiyama
9,167,994 B2 10/2015 Akiyama
9,450,133 B2 9/2016 Nakamura et al.
9,465,429 B2 10/2016 Kitchens, II et al.
9,494,995 B2 11/2016 Kitchens, II et al.
9,606,606 B2 3/2017 Kitchens, II et al.
9,798,372 B2 10/2017 Kitchens, II et al.
10,031,602 B2 7/2018 Kitchens, II et al.
10,296,114 B2 5/2019 Lee et al.
10,551,662 B2 2/2020 Kimura et al.
11,029,766 B2 6/2021 Narita et al.
2002/0017612 A1 2/2002 Yu et al.
2003/0067441 A1 4/2003 Hamana et al.
2003/0132912 A1 7/2003 Hamana et al.
2004/0052279 A1 3/2004 Miyairi et al.
2004/0171237 A1 9/2004 Tanaka et al.
2004/0203248 A1 10/2004 Miyairi et al.
2004/0253838 A1 12/2004 Yamazaki et al.
2005/0006648 A1 1/2005 Yamazaki et al.
2005/0025025 A1 2/2005 Nomura et al.
2005/0037553 A1 2/2005 Tanaka
2005/0200291 A1 9/2005 Naugler et al.
2005/0200292 A1 9/2005 Naugler et al.
2005/0200294 A1 9/2005 Naugler et al.
2005/0200296 A1 9/2005 Naugler et al.
2005/0285822 A1 12/2005 Reddy et al.
2006/0007204 A1 1/2006 Reddy et al.
2006/0007205 A1 1/2006 Reddy et al.
2006/0007206 A1 1/2006 Reddy et al.
2006/0007248 A1 1/2006 Reddy et al.
2006/0007249 A1 1/2006 Reddy et al.
2006/0141754 A1 6/2006 Tanaka et al.
2008/0121819 A1 5/2008 Tanaka et al.
2008/0150848 A1* 6/2008 Chung .................... G06F 3/042 345/82
2008/0151262 A1 6/2008 Tanaka et al.
2009/0079345 A1 3/2009 Inuiya
2010/0133520 A1 6/2010 Bressers et al.
2010/0134735 A1 6/2010 Nakamura et al.
2010/0220041 A1 9/2010 Smith
2010/0225617 A1 9/2010 Yoshimoto et al.
2012/0001878 A1 1/2012 Kurokawa et al.
2012/0044444 A1 2/2012 Park et al.
2012/0056252 A1 3/2012 Aoki et al.
2012/0085890 A1 4/2012 Kurokawa
2012/0118352 A1 5/2012 Asami
2013/0027356 A1 1/2013 Nishida
2013/0044917 A1 2/2013 Kurokawa
2013/0162778 A1 6/2013 Kurokawa
2013/0250274 A1 9/2013 Kurokawa
2013/0299789 A1 11/2013 Yamazaki et al.
2014/0239183 A1 8/2014 Yamazaki et al.
2014/0350366 A1* 11/2014 Akiyama .............. H10K 65/00 600/328
2014/0354597 A1 12/2014 Kitchens, II et al.
2014/0361980 A1 12/2014 Iwaki et al.
2015/0301636 A1 10/2015 Akimoto et al.
2015/0316958 A1 11/2015 Takesue
2015/0340094 A1 11/2015 Tamura
2016/0103359 A1 4/2016 Kimura et al.
2018/0084314 A1 3/2018 Koyama
2021/0159252 A1 5/2021 Okamoto et al.
2021/0327979 A1 10/2021 Kamada et al.

FOREIGN PATENT DOCUMENTS

CN 101753861 A 6/2010
CN 101825462 A 9/2010
CN 102376723 A 3/2012
CN 105229580 A 1/2016
CN 105308669 A 2/2016
EP 1055260 A 11/2000
EP 1723397 A 11/2006
EP 1779366 A 5/2007
EP 1983592 A 10/2008
EP 2226710 A 9/2010
EP 3005023 A 4/2016
EP 3012820 A 4/2016
EP 3015961 A 5/2016
JP 09-044311 A 2/1997
JP 2000-207118 A 7/2000
JP 2002-502129 1/2002
JP 2003-173235 A 6/2003
JP 2005-292503 A 10/2005
JP 2007-535728 12/2007
JP 2010-015398 A 1/2010
JP 2010-211324 A 9/2010
JP 2010-530026 9/2010
JP 2012-044143 A 3/2012
JP 2012-098766 A 5/2012
JP 2012-230653 A 11/2012
JP 2013-073965 A 4/2013
JP 2014-197522 A 10/2014
JP 2015-019073 A 1/2015
JP 2016-530590 9/2016
JP 2018-040806 A 3/2018
KR 2001-0040510 A 5/2001
KR 2010-0061393 A 6/2010
KR 2011-0018755 A 2/2011
KR 2012-0017943 A 2/2012
KR 2016-0007590 A 1/2016
KR 2016-0014708 A 2/2016
TW 201504721 2/2015
WO WO-1999/039395 8/1999
WO WO-2005/081810 9/2005
WO WO-2006/005033 1/2006
WO WO-2008/127111 10/2008
WO WO-2014/197243 12/2014
WO WO-2014/197245 12/2014
WO WO-2014/197247 12/2014
WO WO-2014/197252 12/2014
WO WO-2014/203711 12/2014
WO WO-2014/208168 12/2014
WO WO-2017/126153 7/2017

(56) References Cited

OTHER PUBLICATIONS

Written Opinion (Application No. PCT/IB2020/050067) Dated Mar. 24, 2020.

* cited by examiner 59
11
61
21
60
30
VL
12

DISPLAY SYSTEM, DISPLAY DEVICE, AND LIGHT-EMITTING APPARATUS

This application is a continuation of copending U.S. application Ser. No. 18/093,435, filed on Jan. 5, 2023 which is a continuation of U.S. application Ser. No. 17/422,891, filed on Jul. 14, 2021 (now U.S. Pat. No. 11,550,407 issued Jan. 10, 2023) which is a 371 of international application PCT/IB2020/050067 filed on Jan. 7, 2020 which are all incorporated herein by reference.

TECHNICAL FIELD

One embodiment of the present invention relates to a display system. One embodiment of the present invention relates to a display device. One embodiment of the present invention relates to an input device. One embodiment of the present invention relates to a light-emitting apparatus.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, larger-sized display devices have been manufactured. Examples of uses for a large-sized display device include a television device for home use (also referred to as a TV or a television receiver), digital signage, and a PID (Public Information Display).

Light-emitting apparatuses including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

With the size of a display device being increased, the screen can be seen by a large number of people. For display devices to be used for presentations, multiplayer games at an amusement facility, or the like, the display devices are required not only to be viewed but also to be operated.

A laser pointer, which is often used for presentations at a meeting, for example, is capable of pointing a portion where a user pays attention, but is not capable of operating a screen. Thus, the user making the presentations need to do two actions simultaneously, i.e., making the presentations while pointing a laser pointer at the screen and operating the screen with a mouse or a controller, which hinders the user from giving presentations smoothly. In addition, users other than the one making the presentations are unable to operate the screen.

An object of one embodiment of the present invention is to provide a highly convenient display system. Another object is to provide a display system enabling a screen to be operated easily with a laser pointer. Another object is to provide a display system enabling a screen to be operated by a large number of people. Another object is to provide a display device and a laser pointer device (a light-emitting apparatus) enabling the above display system. Another object is to provide a display device capable of obtaining positional information on a portion pointed by a laser pointer. Another object is to provide a device capable of operating a screen, which replaces a conventional laser pointer.

Another object of one embodiment of the present invention is to provide a display device with a reduced manufacturing cost. Another object is to provide a high-quality display device, light-emitting apparatus or display system. Another object is to provide a highly reliable display device, light-emitting apparatus, or display system. Another object is to provide a novel display device, light-emitting apparatus, or display system.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a display system including a display device and a light-emitting apparatus. The light-emitting apparatus includes a means for emitting visible light and a means for emitting invisible light. The display device includes a display unit including a means for displaying an image and a means for obtaining positional information on a portion irradiated with the visible light, and a means for receiving the invisible light.

Another embodiment of the present invention is a display system including a display device and a light-emitting apparatus. The light-emitting apparatus includes a means for emitting visible light and a means for emitting invisible light. The display device includes a display unit including a means for displaying an image and a means for obtaining positional information on a portion irradiated with the visible light, and a means for receiving the invisible light. The display system has a function of performing processing in accordance with the positional information when the invisible light is received.

Another embodiment of the present invention is a display system including a display device and a light-emitting apparatus. The display device includes a display unit and a light-receiving unit. The display unit includes a plurality of display elements emitting visible light and a plurality of first light-receiving elements. The plurality of display elements and the plurality of first light-receiving elements are each arranged in a matrix. The light-receiving unit includes a second light-receiving element. The light-emitting apparatus includes a first input means, a second input means, a first light-emitting element, a second light-emitting element, and an oscillator device. The first light-emitting element includes a laser light source exhibiting visible light, and a light emission state is controlled in accordance with an input to the first input means. The second light-emitting element includes a light source exhibiting infrared light, and the oscillator device has a function of controlling a light emission state of the second light-emitting element in accordance with an input to the second input means. The first light-receiving element has a function of receiving the visible light emitted by the first light-emitting element and converting the visible light into a first electric signal. The second light-receiving element has a function of receiving the infrared light emitted by the second light-emitting element and converting the infrared light into a second electric signal.

Another embodiment of the present invention is a display device including a display unit and a light-receiving unit. The display unit includes a plurality of display elements emitting visible light and a plurality of first light-receiving elements receiving visible light. The plurality of display elements and the plurality of first light-receiving elements are each arranged in a matrix. The light-receiving unit includes a second light-receiving element receiving infrared light.

In the above, the display element preferably includes a first pixel electrode, a light-emitting layer, and a common electrode. The first light-receiving element preferably includes a second pixel electrode, an active layer, and the common electrode. It is preferable that the light-emitting layer and the active layer each include a different organic compound. The first pixel electrode and the second pixel electrode are preferably provided over the same plane. The common electrode preferably includes a portion overlapping with the first pixel electrode with the light-emitting layer therebetween, and a portion overlapping with the second pixel electrode with the active layer therebetween.

In the above, the display element and the first light-receiving element preferably include a common layer. In that case, the common layer preferably includes a portion located between the first pixel electrode and the common electrode, and a portion located between the second pixel electrode and the common electrode.

Another embodiment of the present invention is a light-emitting apparatus including a first input means, a second input means, a first light-emitting element, a second light-emitting element, and an oscillator device. The first light-emitting element includes a laser light source exhibiting visible light, and a light emission state is controlled in accordance with an input to the first input means. The second light-emitting element includes a light source exhibiting infrared light. The oscillator device has a function of controlling a light emission state of the second light-emitting element in accordance with an input to the second input means.

One embodiment of the present invention is a display system including the display device according to any of the above and the light-emitting apparatus. In that case, it is preferable that the first light-receiving element have a function of receiving the visible light emitted by the first light-emitting element and converting the visible light into a first electric signal, and the second light-receiving element have a function of receiving the infrared light emitted by the second light-emitting element and converting the infrared light into a second electric signal.

Effect of the Invention

According to one embodiment of the present invention, a highly convenient display system can be provided. A display system enabling a screen to be operated easily with a laser pointer can also be provided. A display system enabling a screen to be operated by a large number of people can also be provided. A display device and a laser pointer device (a light-emitting apparatus) enabling the above display system can also be provided. A display device capable of obtaining positional information on a portion pointed by a laser pointer can also be provided. A device capable of operating a screen, which replaces a conventional laser pointer, can also be provided.

According to one embodiment of the present invention, a display device with a reduced manufacturing cost can also be provided. A high-quality display device, light-emitting apparatus, or display system can also be provided. A highly reliable display device, light-emitting apparatus, or display system can also be provided. A novel display device, light-emitting apparatus, or display system can also be provided.

Note that the description of these effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIG. 15 is a diagram showing a configuration example of a display panel.

MODE FOR CARRYING OUT THE INVENTION

Figure 1A:
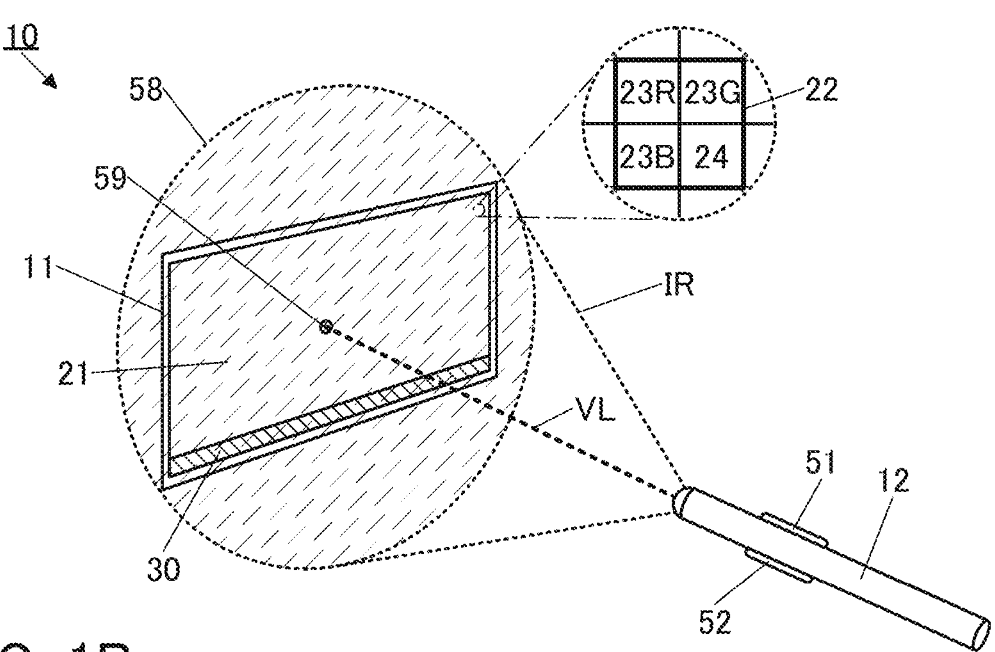
FIG. 1A is a diagram illustrating a configuration example of a display system.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in configurations of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of a transistor in this specification.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacked order (or formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

In this specification and the like, the term "film" and the term "layer" can be interchanged with each other. For example, in some cases, the term "conductive layer" and the term "insulating layer" can be interchanged with the term "conductive film" and the term "insulating film," respectively.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a display system of one embodiment of the present invention will be described.

Overview

The display system of one embodiment of the present invention includes a display device with a display unit (also referred to as a screen) displaying an image and a light-emitting apparatus emitting laser light. The light-emitting apparatus can be used as a laser pointer.

The light-emitting apparatus includes a light source (also referred to as a first light-emitting element or a first light-emitting device) that emits visible laser light. The light-emitting apparatus further includes a light source (also referred to as a second light-emitting element or a second light-emitting device) that emits nonvisible light (invisible light). Nonvisible light does not include visible light but may include ultraviolet light, infrared light, or an electromagnetic wave (electric wave) having a longer wavelength than infrared light. It is preferable to use, as nonvisible light, light having a longer wavelength than visible light, and it is particularly preferable to use infrared light.

Since the visible laser light emitted from the light-emitting apparatus has high directionality and a narrow irradiation range, a certain region of the display unit can be pointed at by being irradiated with the visible laser light. By contrast, light with lower directionality than that of the above visible laser light, i.e., light with a wide irradiation range can be used as the nonvisible light emitted from the light-emitting apparatus.

A configuration may be employed in which the visible laser light can be emitted by operating a first switch included in the light-emitting apparatus. A configuration may be employed in which the nonvisible light can be emitted by operating a second switch included in the light-emitting apparatus. In this manner, with a configuration in which emission of the visible laser light and nonvisible light can be separately operated, the light-emitting apparatus can be used as a conventional laser pointer when the second switch is not operated. Note that not only physical switches but also sensing devices composed of a variety of sensors such as touch sensors (including touch pads), optical sensors, acoustic sensors, acceleration sensors, and temperature sensors can be used as the first switch and the second switch.

In the display unit of the display device, a plurality of pixels for displaying an image are arranged in a matrix. The pixels each include at least one display element (also referred to as a display device). In addition, a plurality of first light-receiving elements (also referred to as first light-receiving devices) that receive the above visible laser light and convert it into electric signals (also referred to as first electric signals) are arranged in a matrix in the display unit. A photodiode can be used as the first light-receiving element, for example. With the first light-receiving elements being arranged in a matrix in the display unit, the display device can obtain positional information on a position irradiated with the visible laser light.

The display device includes a light-receiving unit in a portion different from the display unit. The light-receiving unit includes a second light-receiving element (also referred to as a second light-receiving device) that receives the above nonvisible light and converts it into an electric signal (also referred to as a second electric signal).

In the display device, when the light-receiving unit receives nonvisible light, various types of processing can be executed on the basis of the positional information on a portion which is irradiated with visible laser light. For example, processing for a character input function, a drawing function, or the like can be executed, as well as processing such as selection, execution, transfer, or the like of an object displayed on the screen. Furthermore, processing for a gesture input function can also be executed in accordance with the locus of positions irradiated with visible laser light. Note that the types of processing given here are merely examples of the processing the display system can execute, and various types of processing may be executed in accordance with application software incorporated in the display system.

As described above, in the display system of one embodiment of the present invention, the light-emitting apparatus functioning as a laser pointer can also function as an input device such as a pointing device. This removes the necessity for an input device such as a mouse or a touch pad that has been conventionally needed, which leads to an increase in convenience.

Furthermore, when information is included in the nonvisible light emitted from the light-emitting apparatus, the display system can further be improved in convenience. For example, when nonvisible light includes identification information on a light-emitting apparatus, a plurality of users can operate the display system at the same time. Furthermore, nonvisible light can include information depending on the configuration or operation method of the second switch for controlling the nonvisible light. For example, the time, timing, or the like of emission of nonvisible light is used as information, whereby a function equivalent to clicking, double-clicking, or long pressing of a mouse can be performed. In addition, providing a plurality of the second switches or using an input means such as touch-pad or dialing as the second switch enables analog input. In the case where information is included in nonvisible light, the data is preferably overlapped with the nonvisible light by a modulation method such as pulse position modulation (PPM) or the like.

Here, the display element and the first light-receiving element provided in the display unit of the display device are preferably formed over the same substrate. In that case, an organic electroluminescent element (organic EL element) containing an organic compound in a light-emitting layer is preferably used as the display element and an organic photodiode containing an organic compound in an active layer is preferably used as the first light-receiving element. In addition, some of the manufacturing steps of the display element also serve as some of the manufacturing steps of the first light-receiving element, whereby manufacturing cost can be reduced and the manufacturing yield can be increased.

More specific examples of the display system, the display device, and the light-emitting apparatus of one embodiment of the present invention will be described below with reference to drawings.

Configuration Example of Display System

FIG. 1A shows a schematic view of a display system 10. The display system 10 includes a display device 11 and a light-emitting apparatus 12.

The light-emitting apparatus 12 includes a switch 51 and a switch 52 which are provided on a housing. The light-emitting apparatus 12 can emit visible light VL and infrared light IR from a tip of the housing. The visible light VL and the infrared light IR are emitted independently by the operation of the switch 51 and by the operation of the switch 52, respectively. Here, an example is shown in which a physical switch is used as each of the switch 51 and the switch 52.

As shown in FIG. 1A, the visible light VL is light with high directivity, and the infrared light IR is light with directivity lower than that of the visible light VL. In FIG. 1A, an irradiation region 59 of the visible light VL is indicated by a solid line, and an irradiation region 58 of the infrared light IR is indicated by a dashed line.

Laser light is preferably used as the visible light VL. For example, it is preferable to use red laser light (e.g., light with a peak wavelength of greater than or equal to 620 nm and less than or equal to 700 nm) or green laser light (e.g., light with a peak wavelength of greater than or equal to 500 nm and less than or equal to 550 nm, typically around 532 nm). Furthermore, the laser light is not limited to the above and can be light with a peak wavelength in a visible-light region (e.g., 350 nm to 750 nm); for example, laser light with a variety of colors such as blue, yellow, orange, navy, or purple can also be used.

Light with a peak wavelength in a near-infrared region (greater than or equal to 750 nm and less than or equal to 2500 nm) is preferably used as the infrared light IR. In addition, the directional characteristic (e.g., the viewing angle or full angle at half maximum) of the emission intensity of the infrared light IR is preferably wider than that of the visible light VL. For example, it is preferable to use light with a full angle at half maximum of greater than or equal to 30°, preferably greater than or equal to 40°, further preferably greater than or equal to 50° and less than or equal to 180°. Thus, in the state where a display unit 21 to be described later in the display device 11 is irradiated with the visible light VL, a light-receiving unit 30 provided outside the display unit 21 can be irradiated with the infrared light IR.

The display device 11 includes the display unit 21 and the light-receiving unit 30.

The display unit 21 is a region of the display device 11 where an image is displayed, and can also be referred to as a screen. The display unit 21 has a function of receiving the visible light VL emitted from the light-emitting apparatus 12 and obtaining positional information on the irradiation region 59 that is irradiated with the visible light VL. Here, it is preferable that the diameter and the area of the irradiation region 59 on the display unit 21 be sufficiently smaller than (at least 1/10 smaller than) the length in the short-side direction and the area of the display unit 21.

A plurality of display elements 23 and a plurality of light-receiving elements 24 are respectively arranged in a matrix in the display unit 21. FIG. 1A shows an enlarged view of part of the display unit 21. An example is shown here in which one pixel 22 includes a display element 23R emitting red light, a display element 23B emitting blue light, a display element 23G emitting green light (hereinafter, the display elements are collectively referred to as a display element 23 in some cases), and the light-receiving element 24 that receives visible light to convert the visible light into an electric signal.

The arrangement interval of the display elements 23 and the arrangement interval of the light-receiving elements 24 are the same here; however, the arrangement interval of the light-receiving elements 24 may be longer than the arrangement interval of the display elements 23. It is acceptable as long as the arrangement interval of the light-receiving elements 24 is shorter than the diameter of the irradiation region 59. The arrangement interval of the light-emitting elements 24 can be shorter than or equal to 10 mm, preferably shorter than or equal to 5 mm, and more preferably less than or equal to 3 mm, for example. The shorter the arrangement interval is, the more accurately the position of the irradiation region 59 can be detected. In the case where the arrangement interval of the display elements 23 and the arrangement interval of the light-receiving elements 24 are different, the arrangement interval of the light-receiving elements 24 is preferably the integral multiple of the arrangement interval of the display elements 23 for easier design.

Laser light can be used as the visible light VL emitted from the light-emitting apparatus 12; thus, the illuminance of the visible light VL with which the irradiation region 59 is irradiated is extremely higher than that of external light. Therefore, the area of the light-receiving element 24, more specifically, the effective light-receiving area of the light-receiving element 24 can be sufficiently smaller than the effective light-emitting area of the display element 23. Thus, the reduction in the aperture ratio (effective display area ratio) of the display unit 21 caused by the provision of the light-receiving element 24 can be extremely small. In addition, the sensitivity of the light-receiving element 24 is not required to be high, so the range of choices for materials used for an active layer of the light-receiving element 24 can be widened, and the cost can be lowered.

The light-receiving unit 30 has a function of receiving the infrared light IR emitted from the light-emitting apparatus 12 and converting the infrared light IR into an electric signal. The light-receiving unit 30 may be provided with a plurality of light-receiving elements that receive the infrared light IR or one light-receiving element. An example in which the light-receiving unit 30 is provided outside the display unit 21 is shown here; however, the light-receiving unit 30 may be positioned inside the outline of the display unit 21, or a configuration may be employed in which an aperture that transmits the infrared light IR is provided in the display unit 21 and the light-receiving unit 30 is provided to overlap with the aperture. Furthermore, in the case where the display unit 21 transmits the infrared light IR, the light-receiving unit 30 may be provided on the backside of the display unit 21. In a manner similar to the light-receiving element 24 included in the display unit 21, a light-receiving element that constitutes the light-receiving unit 30 may be formed in the display unit 21. Alternatively, an element that can receive both the visible light VL and the infrared light IR may be used as the light-receiving element 24 and the display unit 21 may also serve as the light-receiving unit 30.

Configuration Example of Display Device

Figure 1B:
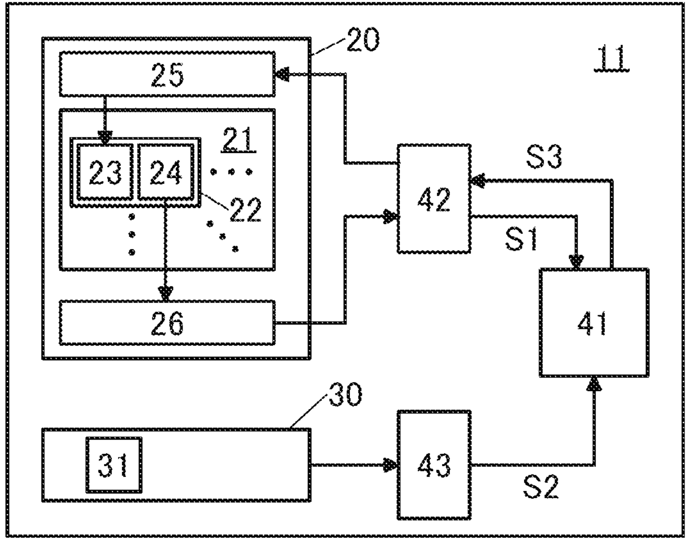
FIG. 1B is a diagram illustrating a configuration example of a display device.

FIG. 1B is a block diagram showing an example of the display device 11. The display device 11 includes a display panel 20, the light-receiving unit 30, a control unit 41, a driver unit 42, a driver unit 43, and the like.

The display panel 20 includes the display unit 21, a driver circuit 25, a driver circuit 26, and the like. The display unit 21 includes a plurality of pixels 22 arranged in a matrix. Here, an example in which the pixel 22 includes the display element 23 and the light-receiving element 24 is shown.

The driver circuit 25 is a circuit for controlling driving of the display element 23. A circuit having a function of a source driver and a gate driver, for example, can be used as the driver circuit 25. The driver circuit 25 drives the pixels 22 in accordance with signals supplied from the driver unit 42 so that an image can be displayed on the display unit 21.

The driver circuit 26 has a function of controlling driving of the light-receiving element 24 and a function of reading an electric signal output from the light-receiving element 24 and outputting the electric signal to the driver unit 42. A circuit having a function of a readout circuit including a plurality of sense amplifiers, AD converters, or the like and a function of a selection circuit selecting the light-receiving element 24, for example, can be used as the driver circuit 26.

The light-receiving unit 30 includes at least one light-receiving element 31. The light-receiving unit 30 has a function of driving the light-receiving element 31 and a function of outputting, to the driver unit 43, an electric signal output from the light-receiving element 31.

The driver unit 42 has a function of generating a signal to be output to the display panel 20, in accordance with a signal input from the control unit 41, and outputting the signal, and a function of converting a signal input from the display panel 20 into a signal to be output to the control unit 41 and outputting the signal. The driver unit 42 includes, for example, a timing controller, a DA converter, an AD converter, an amplifier, a buffer, and the like.

The driver unit 43 has a function of generating a signal to be output to the light-receiving unit 30, in accordance with a signal input from the control unit 41, and outputting the signal, and a function of converting a signal input from the light-receiving unit 30 into a signal to be output to the control unit 41 and outputting the signal. The driver unit 43 includes, for example, a timing controller, a DA converter, an AD converter, an amplifier, a buffer, and the like.

In FIG. 1B, a signal S1 and a signal S2, which are input to the control unit 41, and a signal S3, which is output by the control unit 41, are indicated by arrows. The signal S1 contains data on the positional information on the irradiation region 59 of the visible light VL received by the display unit 21, and the like. The signal S2 contains data related to the infrared light IR received by the light-receiving unit 30, and the like. The control unit 41 can perform various types of processing in accordance with the signal S2 and the signal S3. In addition, in accordance with the processing, the control unit 41 can generate the signal S3 containing data on an image to be displayed on the display unit 21 and output the signal S3 to the driver unit 42.

The control unit 41 can have a configuration including a processor such as a CPU (Central Processing Unit) or a GPU (Graphics Processing Unit). The control unit 41 interprets and executes instructions from various programs with use of a processor to process various kinds of data and control programs. Programs that might be executed by the processor may be stored in a memory region of the processor or may be stored in a different memory module.

Figure 2A:
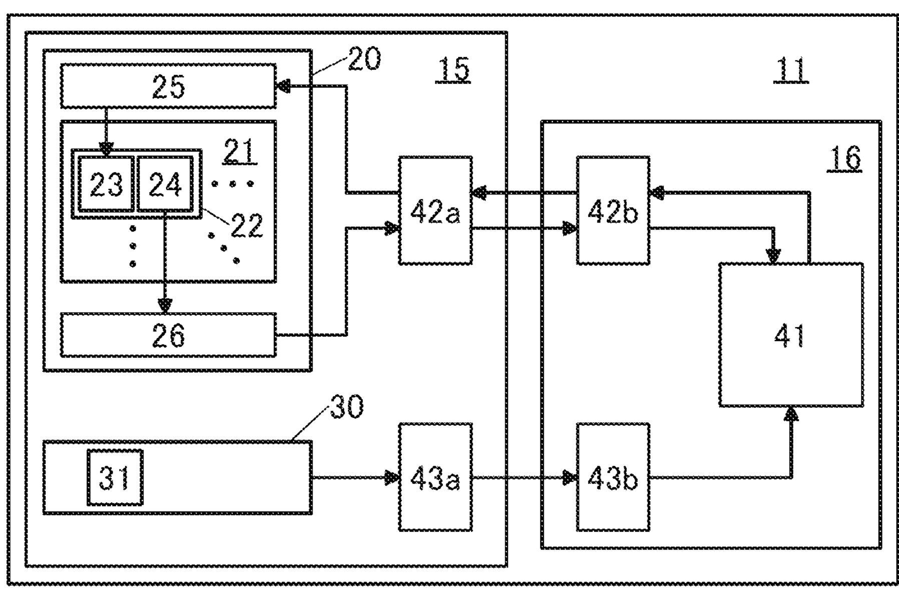
FIG. 2A and FIG. 2B are diagrams each illustrating a configuration example of a display device.
Figure 2B:
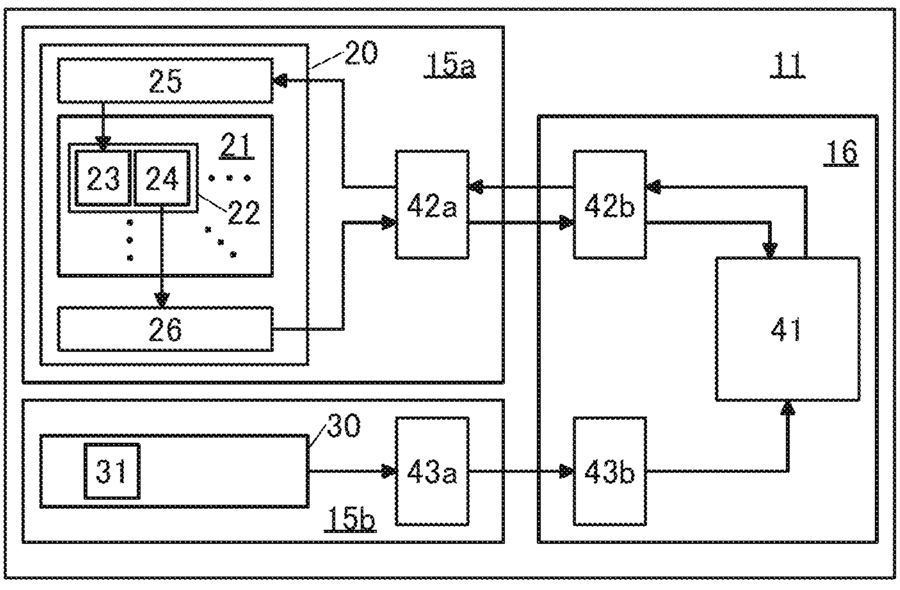

FIG. 2A and FIG. 2B each show a different configuration example of the display device 11.

The configuration shown in FIG. 2A illustrates an example in which the display device 11 is divided into a display module 15 and a control device 16. This is an example of a case where a computer is used as the control device 16, for example. In that case, the display module 15 can function as a monitor device, a television device, or the like that can be connected to a computer with a cable, wireless communication, or the like.

The display module 15 includes the display panel 20, the light-receiving unit 30, a driver unit 42*a*, and a driver unit 43*a*. The control device 16 includes the control unit 41, a driver unit 42*b*, and a driver unit 43*b*.

The driver unit 42*a* and the driver unit 42*b* each have a function of an interface for communication between the display module 15 and the control device 16; other than that, the driver unit 42*a* and the driver unit 42*b* make up a pair having a function similar to that of the above-described driver unit 42. The driver unit 42*a* and the driver unit 42*b* are capable of encoding, combining, or the like of electric signals in accordance with the communication standards, and capable of transmitting signals between the two, for example. Similarly, the driver unit 43*a* and the driver unit 43*b* each have a function of an interface.

Note that the driver unit 42*a* and the driver unit 43*a*, or the driver unit 42*b* and the driver unit 43*b* are described as separate components from each other here to make the description easier; however, the driver unit 42*a* and the driver unit 43*a* or the driver unit 42*b* and the driver unit 43*b* can each be fabricated as one component.

The configuration shown in FIG. 2B is an example in which the display device 11 is divided into a display module 15*a*, a light-receiving module 15*b*, and the control device 16. A configuration that the display module 15*a* and the light-receiving module 15*b* each have is similar to the configuration of the display module 15 shown in FIG. 2A.

Configuration Example of Light-Emitting Apparatus

Figure 1C:
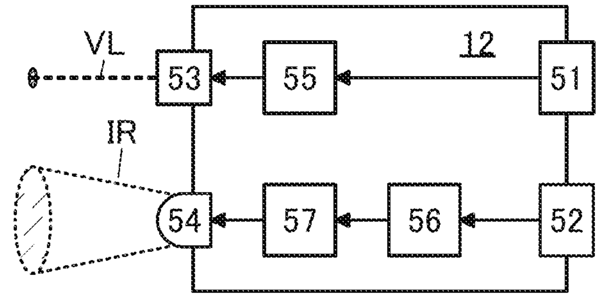
FIG. 1C is a diagram illustrating a configuration example of a light-emitting apparatus.

FIG. 1C is a block diagram showing an example of the light-emitting apparatus 12. The light-emitting apparatus 12 includes the switch 51, the switch 52, a light-emitting element 53, a light-emitting element 54, a driver unit 55, a signal generation unit 56, a driver unit 57, and the like.

The light-emitting element 53 functions as a light source emitting the visible light VL, which is visible laser light. A semiconductor laser element, in particular, is preferably used as the light-emitting element 53, in which case the light-emitting apparatus 12 can be lightweight.

Examples of the semiconductor laser element that can be used as the light-emitting element 53 include an edge emitting laser (EEL) and a surface emitting laser (SEL). Examples of the surface emitting laser include a vertical cavity surface emitting laser (VCSEL) and a vertical external cavity surface emitting laser (VECSEL).

As the light-emitting element 53, a semiconductor laser element that satisfies Class 1, Class 1M, Class 2, or Class 2M in accordance with classification by Japanese Industrial Standards (JIS C 6802) or IEC standards (IEC 60825-1) is preferably used. For example, a semiconductor laser element with a laser output value of 1 mW or less, or approximately 0.2 mW is preferably used.

The driver unit 55 has a function of controlling light emission or non-light emission of the light-emitting element 53, in accordance with the operation of the switch 51. The simplest configuration of the driver unit 55 can be a configuration in which a physical switch is used as the switch 51, and the switch 51, a power source, and the light-emitting element 53 are connected in series. An appropriate circuit or the like can be used for the driver unit 55, depending on the configurations of the switch 51 and the light-emitting element 53, the light-emitting method of the light-emitting element 53, or the like.

The light-emitting element 54 functions as a light source emitting the infrared light IR. A light emitting diode (LED) can be suitably used as the light-emitting element 54.

The light-emitting diode can be a bullet type, a surface mount device (SMD) type, a chip on board (COB) type, or the like. The use of the bullet type LED can reduce the cost. The use of the surface mount type LED or the chip on board type LED can improve the luminance and durability.

The signal generation unit 56 is a circuit that generates a signal for superimposing data on the infrared light IR emitted from the light-emitting element 54. The signal generation unit 56 can generate a signal in accordance with a modulation method such as a pulse position modulation method, in response to the operation of the switch 52, and output the signal to the driver unit 57.

The driver unit 57 has a function of controlling light emission and non-light emission of the light-emitting element 54 in accordance with the signal generated in the signal generation unit 56.

The signal generation unit 56 and the driver unit 57 can be collectively referred to as an oscillator device. The oscillator device has a function of controlling a light emission state of the light-emitting element 54 in accordance with an input to the switch 52.

Here, data generated in the signal generation unit 56 preferably contains identification data of devices. This enables the display system 10 to be operated by a plurality of users at a time.

In FIG. 1C, a configuration of the light-emitting apparatus 12 in which a system with the switch 51 to the light-emitting element 53 and a system with the switch 52 to the light-emitting element 54 are independent from each other is shown. With this configuration, the light-emitting apparatus 12 can be fabricated very easily, which can reduce the manufacturing cost. Note that the configuration of the light-emitting apparatus 12 is not limited to this; it is acceptable as long as the configuration includes at least the light-emitting element 53, the light-emitting element 54, and an operation means such as a switch.

Processing Example of Display System

The display system of one embodiment of the present invention can perform various types of processing depending on the positional information on an irradiation region of visible light emitted from a light-emitting apparatus operated by a user and information contained in infrared light. Most of the processing performed by the display system involves changes of images displayed on a display unit. In that case, the display system has a function of performing the processing for generating a new image and updating a screen.

Furthermore, the display system of one embodiment of the present invention enables the screen to be remotely operated by users from locations physically apart from the screen, with a light-emitting apparatus serving as a laser pointer as well. An example of operations that can be performed by a user through the processing of the display system will be described hereinafter with reference to drawings.

Note that the following processing method, operation method, performance method, or display method that may be employed by the display system 10 can be referred to as a program, for example. In addition, a program in which the processing method, operation method, performance method, or display method to be described below is written can be stored in a non-temporary storage medium and can be read and executed by an arithmetic device or the like included in the control unit 41 of the display system 10. That is, a program that makes hardware to execute the processing method, operation method, performance method, or display method described below or a non-temporary memory medium where the program is stored is of one embodiment of the present invention.

Operation Method Example 1

Figure 3A:
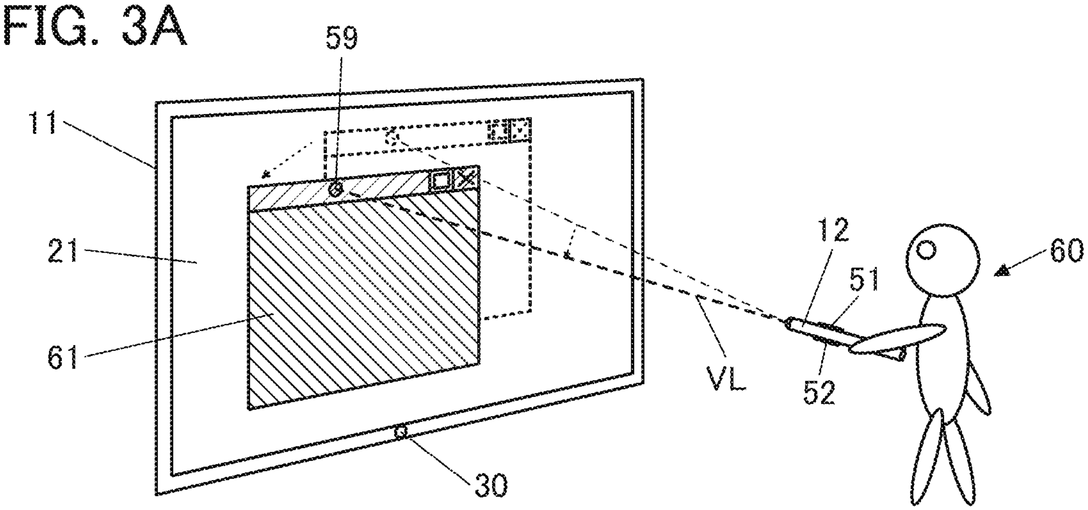
FIG. 3A to FIG. 3C are diagrams each illustrating an example of operation methods of a display system.

FIG. 3A schematically shows the display device 11 and a user 60 operating the screen using the light-emitting apparatus 12.

The user 60 can perform emission of the visible light VL by operating the switch 51 of the light-emitting apparatus 12. In addition, by operating the switch 52 of the light-emitting apparatus 12, the user 60 can make the display system 10 execute various types of processing with the infrared light IR (not shown).

The display device 11 is provided with the display unit 21, and the light-receiving unit 30 in a region that does not overlap with the display unit 21. An object 61 is displayed on the display unit 21.

FIG. 3A shows a state where the user 60 is moving the object 61 displayed on the display unit 21 using the light-emitting apparatus 12.

When the visible light VL is emitted such that the irradiation region 59 is positioned in part of the object 61 (the upper portion of the object 61 in FIG. 3A) and the irradiation region 59 is moved, the object 61 can be moved along the locus of the irradiation region 59.

This operation corresponds to the drag operation in the case of using a mouse. The user 60 can drag the object 61 by moving the irradiation region 59 with the switch 52 being pressed, and can determine the position of the object 61 by releasing the switch 52, for example.

Note that the function of the drag operation is an example; the user 60 can intuitively perform, with the use of the light-emitting apparatus 12, operations equivalent to click, double click, long-press operation, and other operations that are conventionally performed with the use of a mouse. In addition, when two or more switches 52 are provided, the functionality of the light-emitting apparatus 12 can be improved, like a mouse with two or more buttons.

Figure 3B:
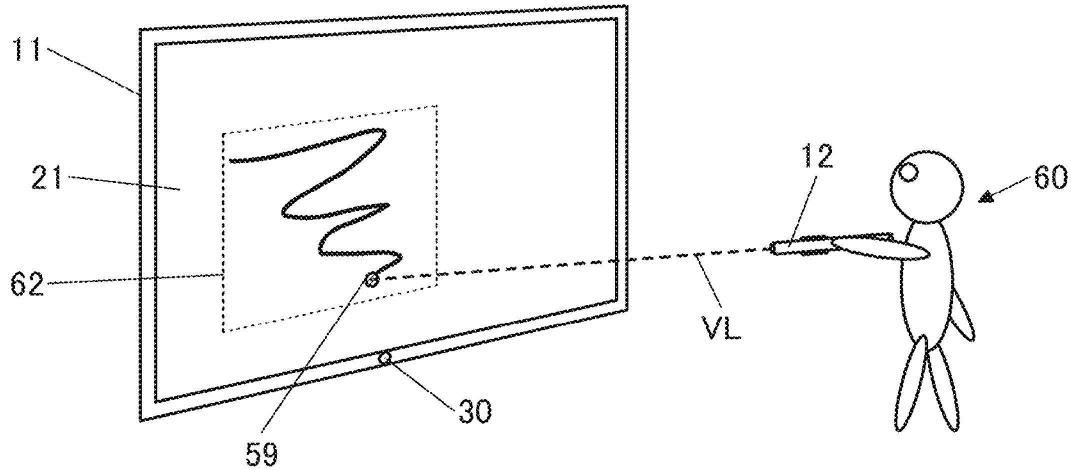

FIG. 3B shows a state where the display system 10 is executing a drawing function. The user 60 can draw a figure (an object 62) or the like along the locus of the irradiation region 59 on the display unit 21 by operating the light-emitting apparatus 12.

Although not shown here, an icon image for changing the thickness, kind, color, or the like of a drawing line may be displayed on the display unit 21, for example. In addition, a function of drawing various figures such as a rectangle, a polygon, a circle, an ellipse, and a half circle as well as a line may be given.

Figure 3C:
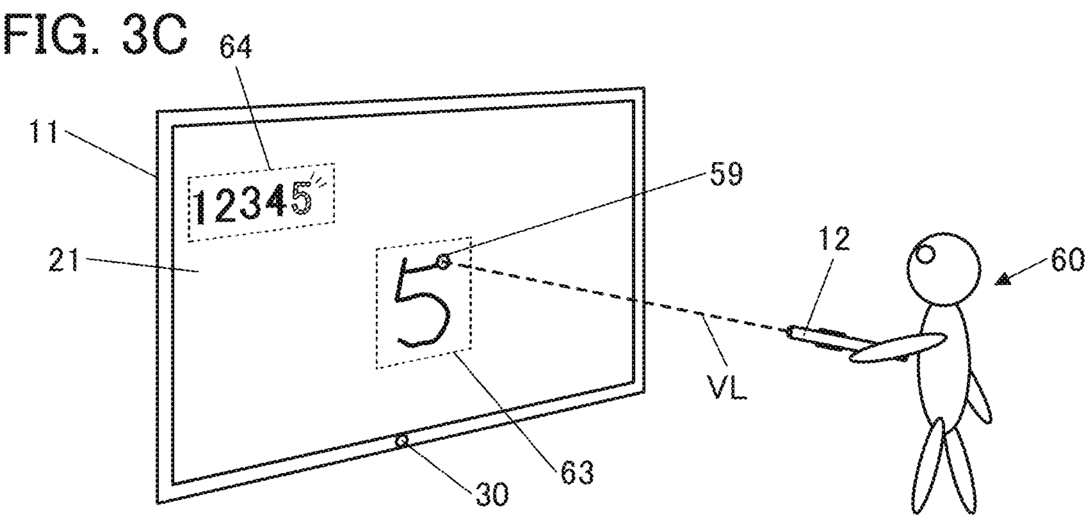

FIG. 3C shows a state where the display system 10 is executing a text-inputting function. The user 60 can draw a text (an object 63) freehand, by operating the light-emitting apparatus 12. The display system 10 can identify the text that best resembles the shape of the object 63, and display the text as text information.

In FIG. 3C, a state where the user 60 draws a numeral "5" and the numeral "5" is displayed as text information.

Operation Method Example 2

The display system 10 may have a function of recognizing the locus of the irradiation region 59 and using this as an input operation (also referred to as a gesture input).

Figure 4A:
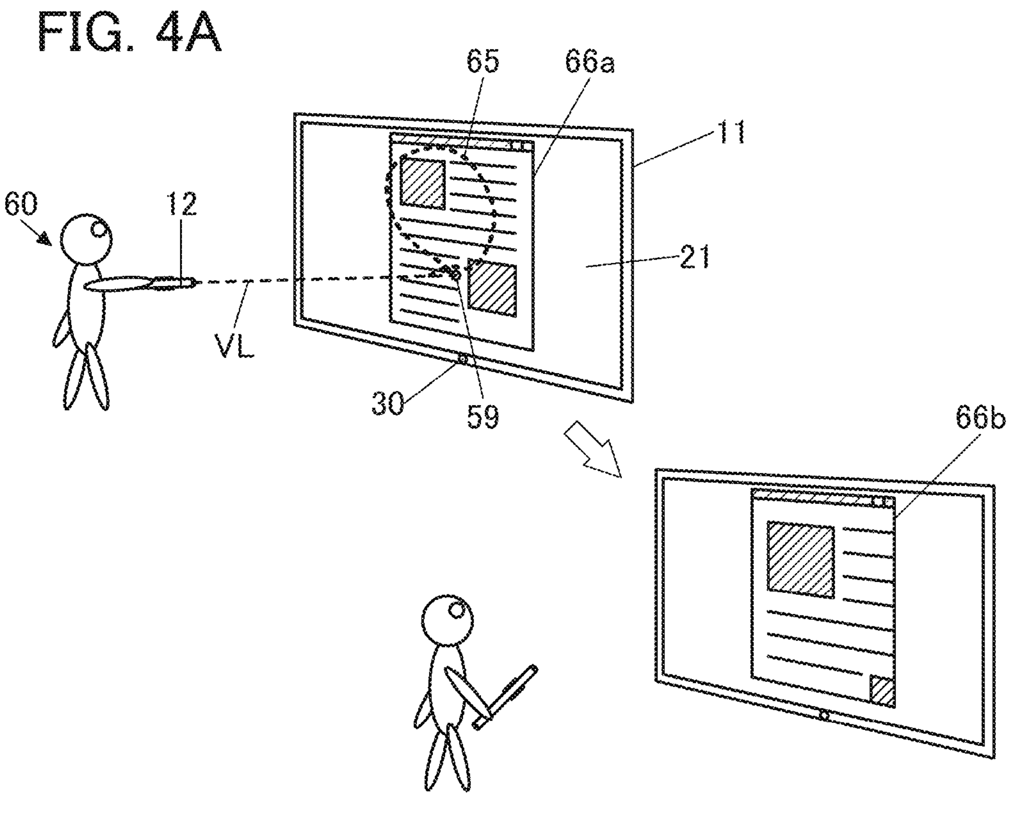
FIG. 4A and FIG. 4B are diagrams each illustrating an example of operation methods of a display system.

FIG. 4A shows a state where an operation of displaying an enlarged image of information included in an object 66*a* is performed by a gesture input. When the user 60 operates the light-emitting apparatus 12 such that a locus 65 of the irradiation region 59 draws a rough circle, the object 66*a* is changed into an object 66*b* with information including the range enclosed by the locus 65 being enlarged.

Figure 4B:
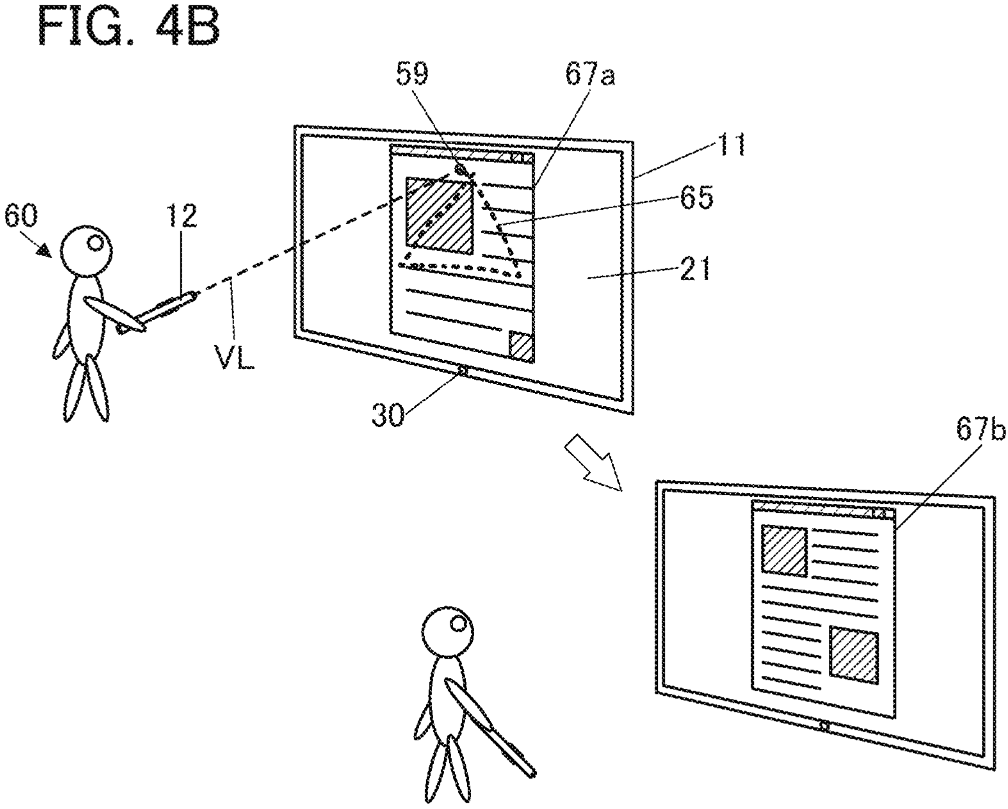

In contrast to the above, FIG. 4B shows a state where an operation of displaying information included in an object 67*a* being reduced in size, is performed by a gesture input. When the user 60 operates the light-emitting apparatus 12 such that the locus 65 of the irradiation region 59 draws a rough triangle, the object 67*a* is changed into an object 67*b* with information including the range enclosed by the locus 65, displayed with a reduced size but with a wider range.

As described above, when the display system 10 has a configuration that allows gesture inputs using the light-emitting apparatus 12, the user 60 can operate the screen more intuitively, which makes the display system 10 more user-friendly.

Operation Method Example 3

A menu for switching the operation modes by the light-emitting apparatus 12 can be displayed on the display unit 21 of the display system 10, which allows the user 60 to select functions from the menu.

Figures 5A, 5B, 5C:
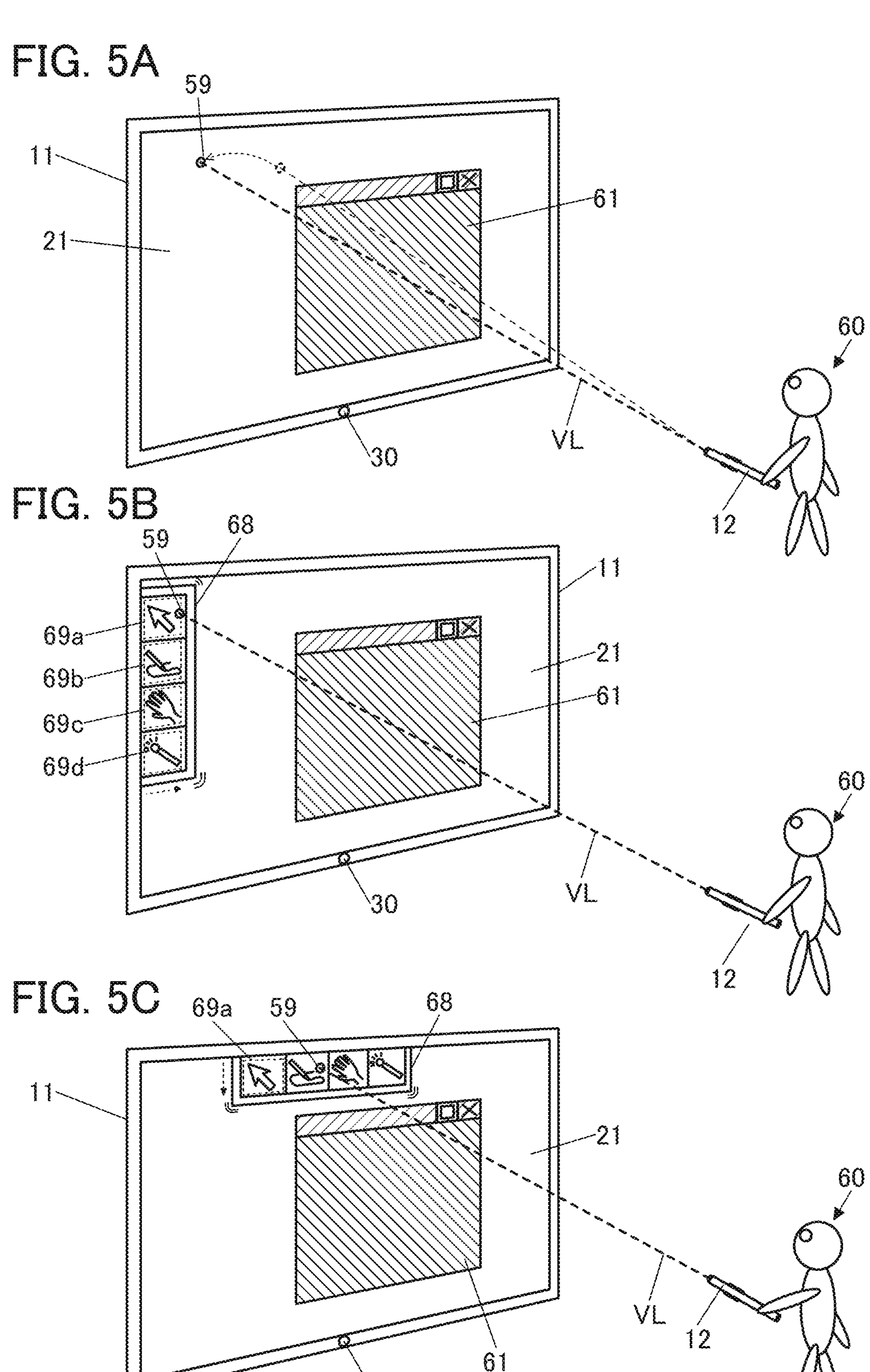
FIG. 5A to FIG. 5C are diagrams each illustrating an example of operation methods of a display system.

FIG. 5A shows a state where an object 61 is displayed on the display unit 21. In this state, when the irradiation region 59 is moved close to the periphery of the display unit 21, a menu image (an object 68) including a variety of icons (here, icons 69*a* to 69*d*) appears as shown in FIG. 5B or FIG. 5C. With a function of hiding the menu image when unnecessary and displaying the menu image when necessary as described above, the display region can be effectively utilized, which is preferable.

FIG. 5B shows an example in which the menu image appears from the side of the display unit 21, and FIG. 5C shows an example in which the menu image appears from the top of the display unit 21. The position where the menu image is displayed may be fixed; the operability can be further improved in the case where the menu image is configured to appear when the irradiation region 59 comes close to anywhere in the periphery of the display unit 21. It is preferable that the position where the menu image appears can be set by a user. Alternatively, display of the menu image may be performed by a gesture input.

By selecting the icon 69*a* shown in FIG. 5C, operation by the light-emitting apparatus 12 can be switched into an object operation mode, for example. By selecting the icon 69*b*, operation by the light-emitting apparatus 12 can be switched into a drawing mode. By selecting the icon 69*c*, operation by the light-emitting apparatus 12 can be switched into a background-image operation mode. By selecting the icon 69*d*, operation by the light-emitting apparatus 12 can be switched into a gesture input mode.

As described above, providing the display system 10 with a function of variously switching the modes eliminates the need for the light-emitting apparatus 12 itself to have a number of functions, and enables operation by the light-emitting apparatus 12 with a simple configuration. Thus, the manufacturing cost of the light-emitting apparatus 12 can be reduced.

Operation Method Example 4

The display system of one embodiment of the present invention can be operated by a plurality of users using light-emitting apparatuses.

Figure 6:
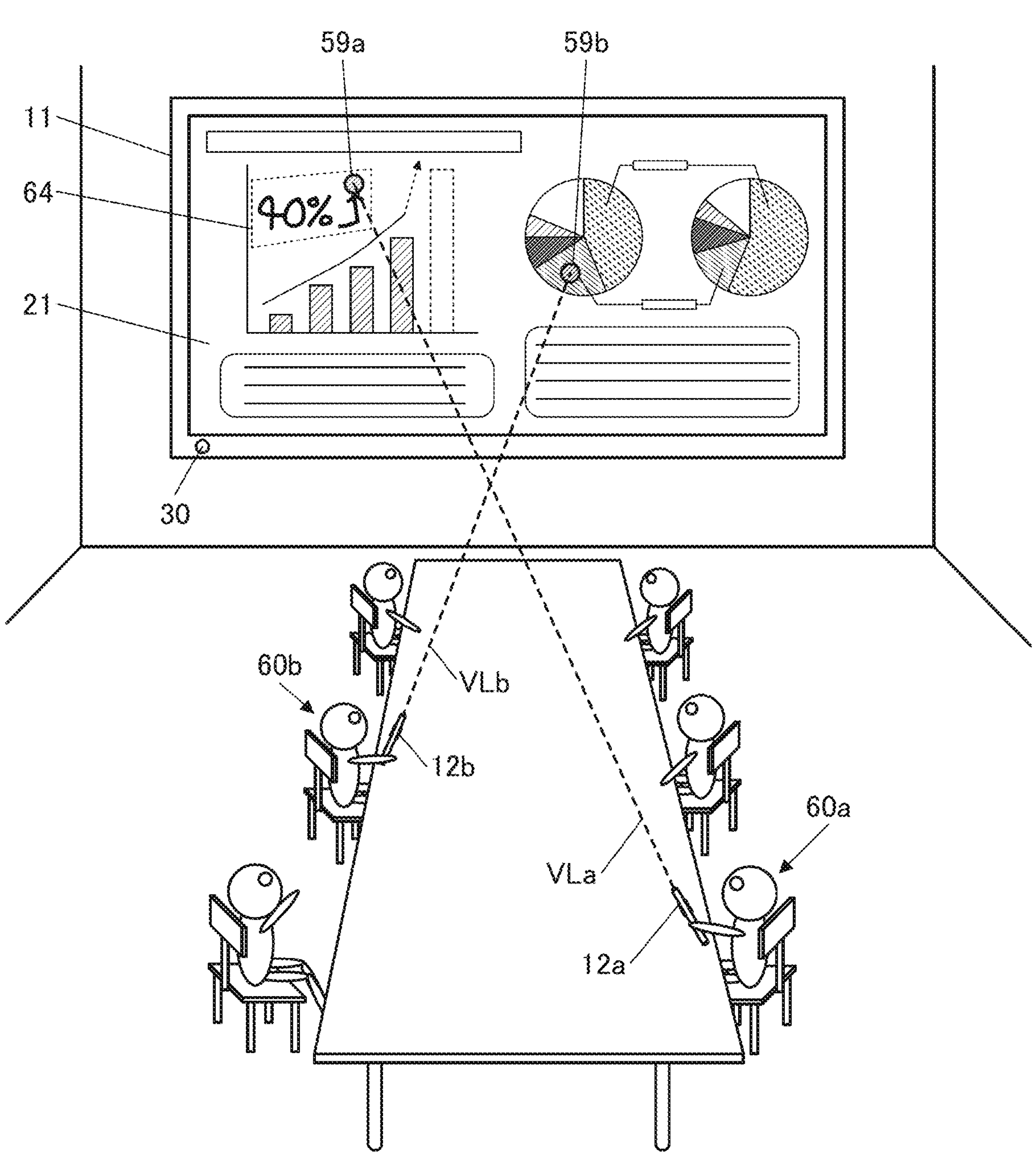
FIG. 6 is a diagram illustrating an example of operation methods of a display system.

FIG. 6 shows a meeting being held with the use of the display system 10. The material used for the meeting is displayed on the display unit 21 of the display device 11.

A user 60*a* and a user 60*b* among people attending the meeting each have a light-emitting apparatus 12*a* or a light-emitting apparatus 12*b*.

The user 60*a* is performing operation in the drawing mode. FIG. 6 shows an irradiation region 59*a* of visible light VLa emitted from the light-emitting apparatus 12*a*, and an image of handwritten texts (an object 64) drawn along the locus of the irradiation region 59*a*.

The user 60*b* is using the light-emitting apparatus 12*b* as a laser pointer. The user 60*b* is pointing a portion of the display unit 21 with an irradiation region 59*b* of visible light VLb.

A piece of different identification information is superimposed on infrared light IR (not shown) emitted from each of the light-emitting apparatus 12*a* and the light-emitting apparatus 12*b*. This enables the user 60*a* and the user 60*b* to operate the screen independently of each other.

The visible light VLa emitted from the light-emitting apparatus 12*a* and the visible light VLb emitted from the light-emitting apparatus 12*b* preferably have different wavelengths. In that case, from which light-emitting apparatus the irradiation region 59*a* or the irradiation region 59*b* is derived can be identified by the wavelength, which allows simultaneous operation by the user 60*a* and the user 60*b*.

It is also possible to distinguish the irradiation region 59*a* from the irradiation region 59*b* by superimposing, on the infrared light IR emitted from each of the light-emitting apparatus 12*a* and the light-emitting apparatus 12*b*, information on the direction in which the visible light VLa or the visible light VLb is emitted. For example, a configuration may be employed in which the light-emitting apparatus 12*a* and the light-emitting apparatus 12*b* each include a sensor that detects the inclination or direction of the apparatus itself (an acceleration sensor, for example), a sensor that detects the direction in which the visible light VLa or the visible light VLb is emitted (a camera, for example), or the like and information obtained by the sensor is transmitted by being superimposed on the infrared light IR.

Alternatively, the display device 11 may include a means for detecting the directions or positions of the light-emitting apparatus 12*a* and the light-emitting apparatus 12*b* (a camera, for example) and have a function of determining the directions in which the visible light VLa and the visible light VLb are emitted.

Figure 7:
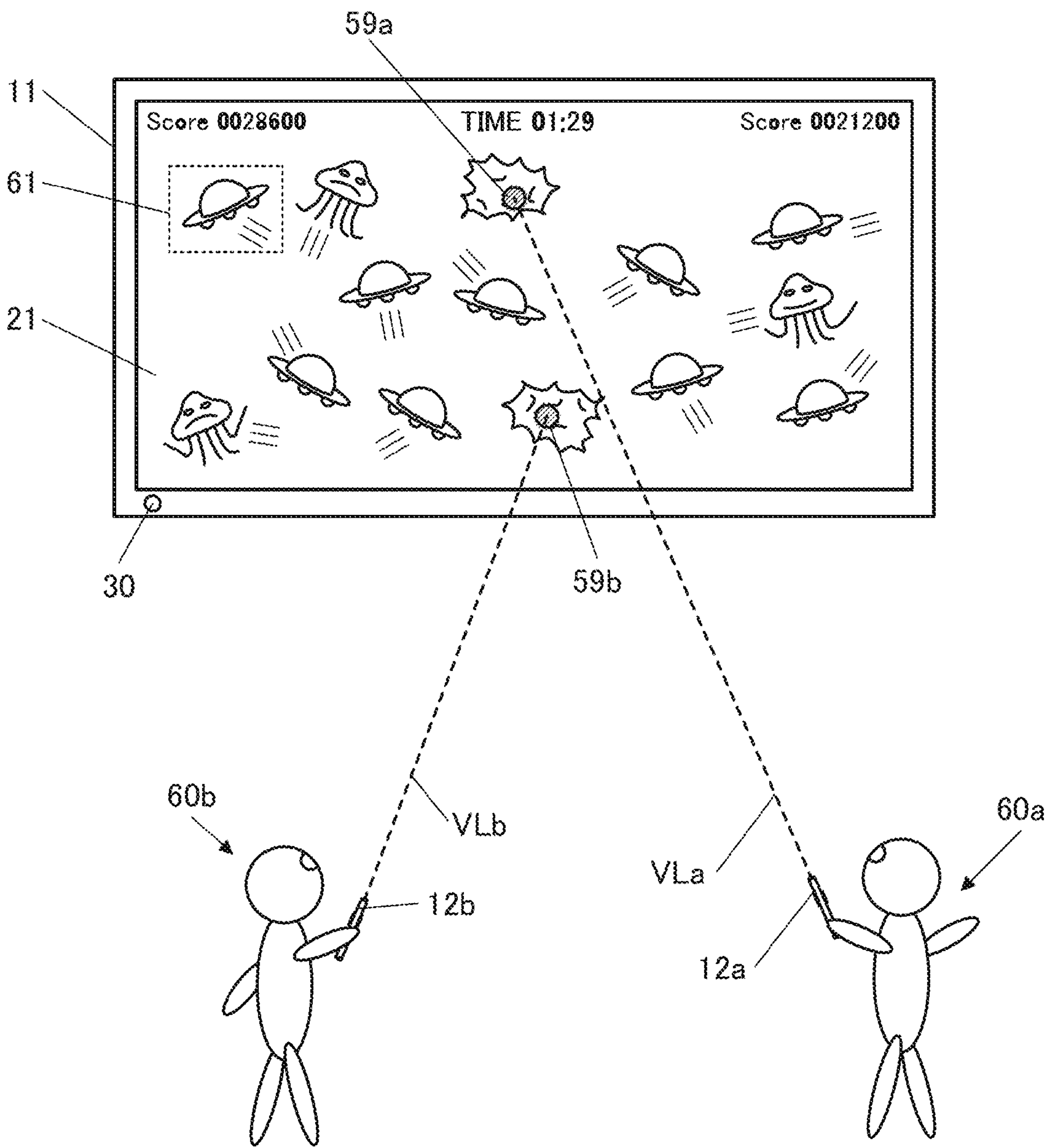
FIG. 7 is a diagram illustrating an example of operation methods of a display system.

FIG. 7 shows a plurality of users of the display system 10 enjoying a game. A plurality of objects 61 shaped like moving flight vehicles or unknown creatures are displayed as targets on the display unit 21.

The user 60*a* and the user 60*b* operate the switch 52 for emitting the infrared light IR (not shown) in a state where the irradiation region 59*a* or the irradiation region 59*b* is pointed at the object 61 to destroy the object 61, whereby the user 60*a* and the user 60*b* can score a point. Points scored by each of the users (indicated as “Score”) and the remaining time (indicated as “TIME”) are displayed on the upper portion of the display unit 21.

The above is the description of examples of operation that can be performed by a user with the processing of the display system.

According to one embodiment of the present invention, the display system that can execute processing based on information on a position irradiated with visible laser light in a display unit and information contained in nonvisible light received by the light-receiving unit and that can reflect the processing result in display can be provided. One embodiment of the present invention is the display device that can achieve the display system, and another embodiment of the present invention is a light-emitting apparatus that can achieve the display system. The display device and the light-emitting apparatus that can constitute the display system can be manufactured and sold independently of each other.

According to one embodiment of the present invention, a display system with a high convenience, a display system capable of easy operation of a screen using a laser pointer, a display system capable of operation of a screen by a plurality of users, or the like can be achieved.

At least part of this embodiment can be implemented in combination with the other embodiments described in this specification as appropriate.

Embodiment 2

In this embodiment, a display panel that can be used for the display system described in Embodiment 1 will be described with reference to drawings.

A display panel of one embodiment of the present invention includes a display element exhibiting visible light and a light-receiving element (a light-receiving device) that receives infrared light. The display element is preferably a light-emitting element (also referred to as a light-emitting device). The light-receiving element is preferably a photoelectric conversion element.

Here, in the case where a light-emitting element is used as the display element, an EL element such as an OLED (Organic Light Emitting Diode) or a QLED (Quantum-dot Light Emitting Diode) is preferably used. As a light-emitting substance of the EL element, a substance emitting fluorescence (a fluorescent material), a substance emitting phosphorescence (a phosphorescent material), a substance exhibiting thermally activated delayed fluorescence (a TADF material), an inorganic compound (e.g., a quantum dot material), or the like can be used. Alternatively, as a light emitting element, to increase the flexibility of an LED such as a micro-LED (Light Emitting Diode)

As the light-receiving element, a pn-type or pin-type photodiode can be used, for example. The light-receiving element functions as a photoelectric conversion element that detects light incident on the light-receiving element and generates charge. The amount of generated charge in the photoelectric conversion element is determined depending on the amount of incident light. It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

The light-emitting element can have a stacked-layer structure including a light-emitting layer between a pair of electrodes, for example. The light-receiving element can have a stacked-layer structure including an active layer between the pair of electrodes. A semiconductor material can be used for the active layer of the light-receiving element. For example, an inorganic semiconductor material such as silicon can be used.

It is particularly preferable to use an organic compound for the active layer of the light-receiving element. In that case, the light-emitting element and one electrode (also referred to as a pixel electrode) of the light-receiving element are preferably provided on the same plane. In addition, the light-emitting element and the other electrode of the light-receiving element are further preferably formed using one continuous conductive layer (also referred to as a common electrode). Furthermore, it is still further preferable that the light-emitting element and the light-receiving element include a common layer. Thus, the manufacturing process of the light-emitting element and the light-receiving element can be simplified, so that the manufacturing cost can be reduced and the manufacturing yield can be increased.

Examples that are more specific will be described below with reference to drawings.

Configuration Example 1 of Display Panel

Configuration Example 1-1

Figure 8A:
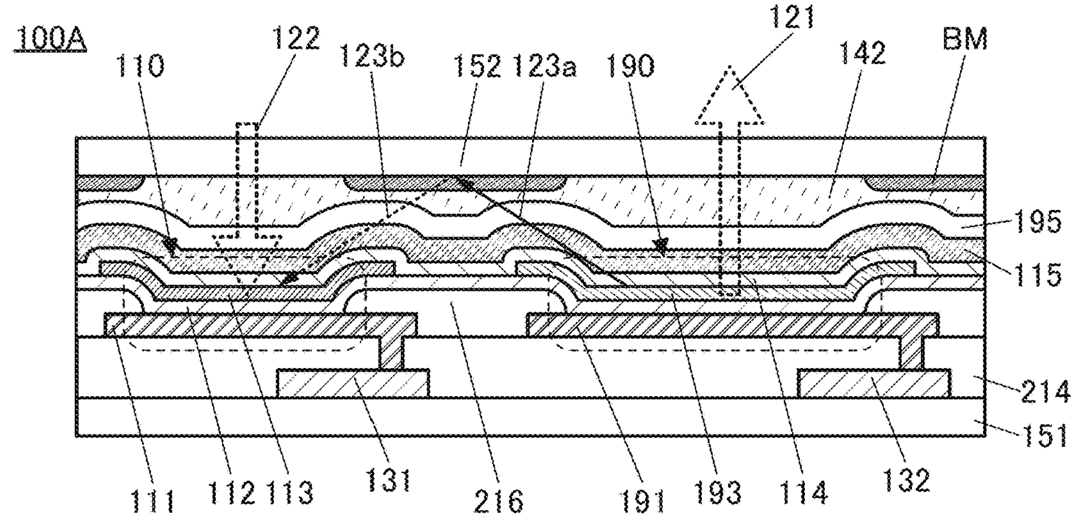
FIG. 8A to FIG. 8C are diagrams each showing a configuration example of a display panel.

FIG. 8A is a schematic cross-sectional view of a display panel 100A.

The display panel 100A includes a light-receiving element 110 and a light-emitting element 190. The light-receiving element 110 includes a pixel electrode 111, a common layer 112, an active layer 113, a common layer 114, and a common electrode 115. The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 includes a first organic compound, and the light-emitting layer 193 includes a second organic compound that is different from the first organic compound.

The common layer 114 is positioned over the common layer 112, the active layer 113, and the light-emitting layer 193. The common layer 114 is shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is shared by the light-receiving element 110 and the light-emitting element 190.

In the display panel of this embodiment, an organic compound is used for the active layer 113 of the light-receiving element 110. In the light-receiving element 110, the layers other than the active layer 113 can be common to the layers in the light-emitting element 190 (the EL element). Therefore, the light-receiving element 110 can be formed concurrently with the formation of the light-emitting element 190 only by adding a step of depositing the active layer 113 in the manufacturing process of the light-emitting element 190. The light-emitting element 190 and the light-receiving element 110 can be formed over one substrate. Accordingly, the light-receiving element 110 can be incorporated in the display panel without a significant increase in the number of manufacturing steps.

The display panel 100A shows an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include a separately formed layer other than the active layer 113 and the light-emitting layer 193 (see display panels 100D, 100E, and 100F to be described later). The light-receiving element 110 and the light-emitting element 190 preferably include at least one layer used in common (common layer). Thus, the light-receiving element 110 can be incorporated in the display panel without a significant increase in the number of manufacturing steps.

The display panel 100A includes the light-receiving element 110, the light-emitting element 190, a transistor 131, a transistor 132, and the like between a pair of substrates (a substrate 151 and a substrate 152).

In the light-receiving element 110, the common layer 112, the active layer 113, and the common layer 114 that are positioned between the pixel electrode 111 and the common electrode 115 can each be referred to as an organic layer (a layer containing an organic compound). The pixel electrode 111 preferably has a function of reflecting visible light. An end portion of the pixel electrode 111 is covered with a partition 216. The common electrode 115 has a function of transmitting visible light.

The light-receiving element 110 has a function of detecting light. Specifically, the light-receiving element 110 is a photoelectric conversion element that receives light 122 entering from the outside through the substrate 152 and converts the light 122 into an electrical signal.

A light-blocking layer BM is provided on a surface of the substrate 152 on the substrate 151 side. The light-blocking layer BM has an opening at a position overlapping with the light-receiving element 110 and an opening at a position overlapping with the light-emitting element 190. Providing the light-blocking layer BM can control the range where the light-receiving element 110 detects light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, part of light emitted from the light-emitting element 190 is reflected in the display panel 100A and is incident on the light-receiving element 110 in some cases. The light-blocking layer BM can reduce the influence of such stray light. For example, in the case where the light-blocking layer BM is not provided, light 123*a* emitted from the light-emitting element 190 is reflected by the substrate 152 and reflected light 123*b* is incident on the light-receiving element 110 in some cases. Providing the light-blocking layer BM can inhibit entry of the reflected light 123*b* into the light-receiving element 110. Consequently, noise can be reduced, and the sensitivity of a sensor using the light-receiving element 110 can be increased.

In the light-emitting element 190, the common layer 112, the light-emitting layer 193, and the common layer 114 that are positioned between the pixel electrode 191 and the common electrode 115 can each be referred to as an EL layer. The pixel electrode 191 preferably has a function of reflecting visible light. An end portion of the pixel electrode 191 is covered with the partition 216. The pixel electrode

111 and the pixel electrode 191 are electrically insulated from each other by the partition 216. The common electrode 115 has a function of transmitting visible light.

The light-emitting element 190 has a function of emitting visible light. Specifically, the light-emitting element 190 is an electroluminescent light-emitting element that emits light 121 toward the substrate 152 when voltage is applied between the pixel electrode 191 and the common electrode 115.

It is preferable that the light-emitting layer 193 be formed not to overlap with a light-receiving region of the light-receiving element 110. Accordingly, it is possible to inhibit the light-emitting layer 193 from absorbing the light 122, so that the amount of light with which the light-receiving element 110 is irradiated can be increased.

The pixel electrode 111 is electrically connected to a source or a drain of the transistor 131 through an opening provided in the insulating layer 214. The end portion of the pixel electrode 111 is covered with the partition 216.

The pixel electrode 191 is electrically connected to a source or a drain of the transistor 132 through an opening provided in the insulating layer 214. The end portion of the pixel electrode 191 is covered with the partition 216. The transistor 132 has a function of controlling driving of the light-emitting element 190.

The transistor 131 and the transistor 132 are on and in contact with the same layer (the substrate 151 in FIG. 8A).

At least part of a circuit electrically connected to the light-receiving element 110 is preferably formed using the same material in the same steps as a circuit electrically connected to the light-emitting element 190. Thus, the thickness of the display panel can be reduced and the manufacturing process can be simplified compared to the case where the two circuits are separately formed.

The light-receiving element 110 and the light-emitting element 190 are preferably covered with a protective layer 195. In FIG. 8A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are attached to each other with an adhesive layer 142.

Figure 9A:
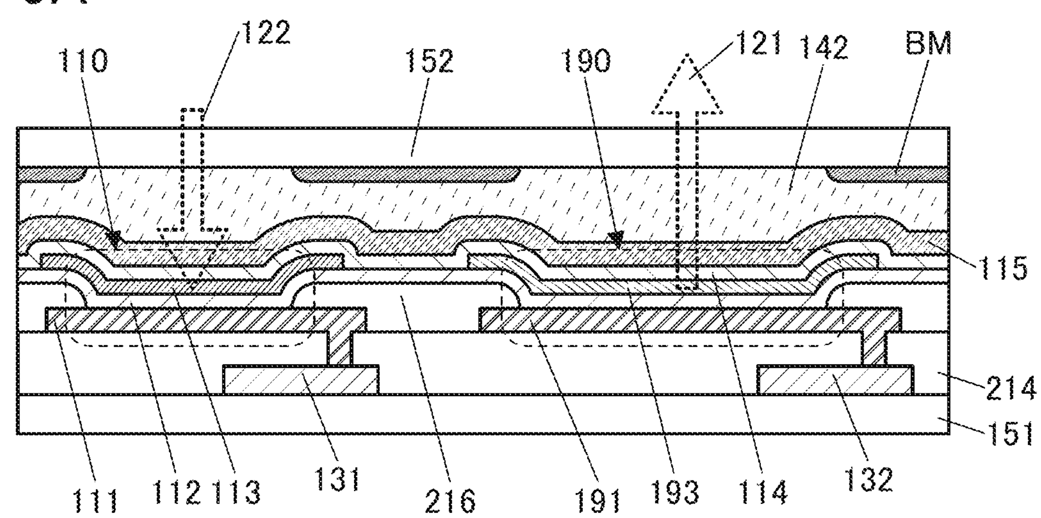
FIG. 9A and FIG. 9B are diagrams each showing a configuration example of a display panel.

Note that as shown in FIG. 9A, the protective layer is not necessarily provided over the light-receiving element 110 and the light-emitting element 190. In FIG. 9A, the common electrode 115 and the substrate 152 are attached to each other with the adhesive layer 142.

Figure 9B:
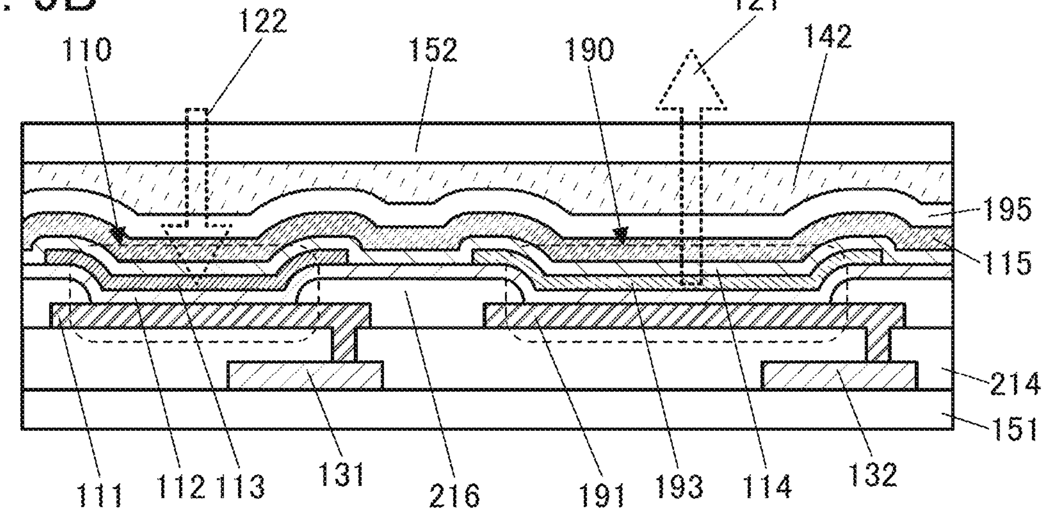

As shown in FIG. 9B, the light-blocking layer BM is not necessarily provided. This structure can increase the light-receiving area of the light-receiving element 110, so that the sensitivity of the sensor can be further increased.

Configuration Example 1-2

Figure 8B:
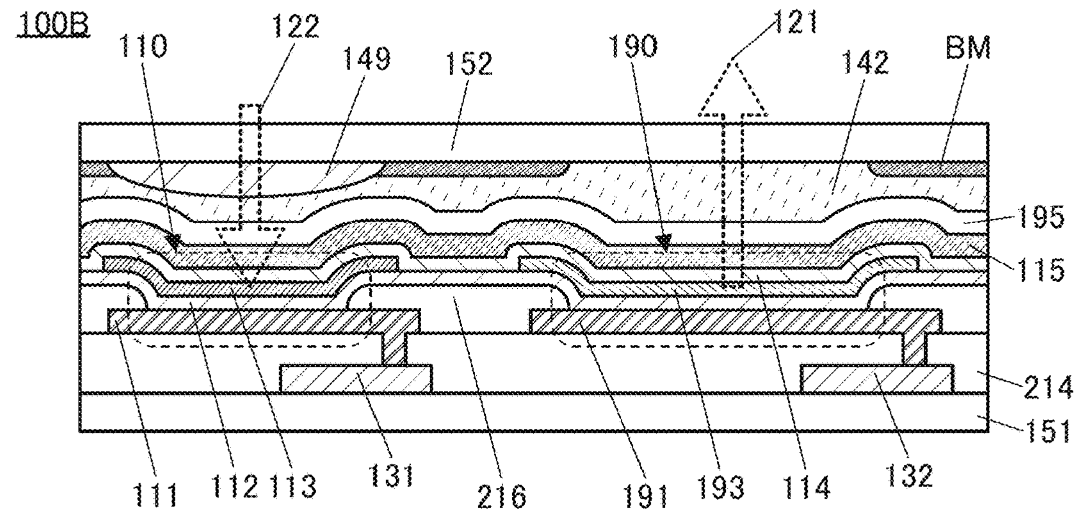

FIG. 8B is a cross-sectional view of a display panel 100B. Note that in the following description of display panels, the description of components similar to those of the above display panel might be omitted.

The display panel 100B shown in FIG. 8B includes a lens 149 in addition to the components of the display panel 100A.

The lens 149 is provided at a position overlapping with the light-receiving element 110. In the display panel 100B, the lens 149 is provided in contact with the substrate 152. The lens 149 included in the display panel 100B is a convex lens having a convex surface on the substrate 151 side. Note that convex lens having a convex surface on the substrate 152 side may be provided in a region overlapping with the light-receiving element 110.

In the case where the light-blocking layer BM and the lens 149 are formed on the same plane of the substrate 152, their formation order is not limited. FIG. 8B shows an example in which the lens 149 is formed first; alternatively, the light-blocking layer BM may be formed first. In FIG. 8B, an end portion of the lens 149 is covered with the light-blocking layer BM.

In the display panel 100B, the light 122 is incident on the light-receiving element 110 through the lens 149. With the lens 149, the amount of the light 122 incident on the light-receiving element 110 can be increased compared to the case where the lens 149 is not provided. This can increase the sensitivity of the light-receiving element 110.

As a method for forming the lens used in the display panel of this embodiment, a lens such as a microlens may be formed directly over the substrate or the light-receiving element, or a lens array formed separately, such as a microlens array, may be attached to the substrate.

Configuration Example 1-3

Figure 8C:
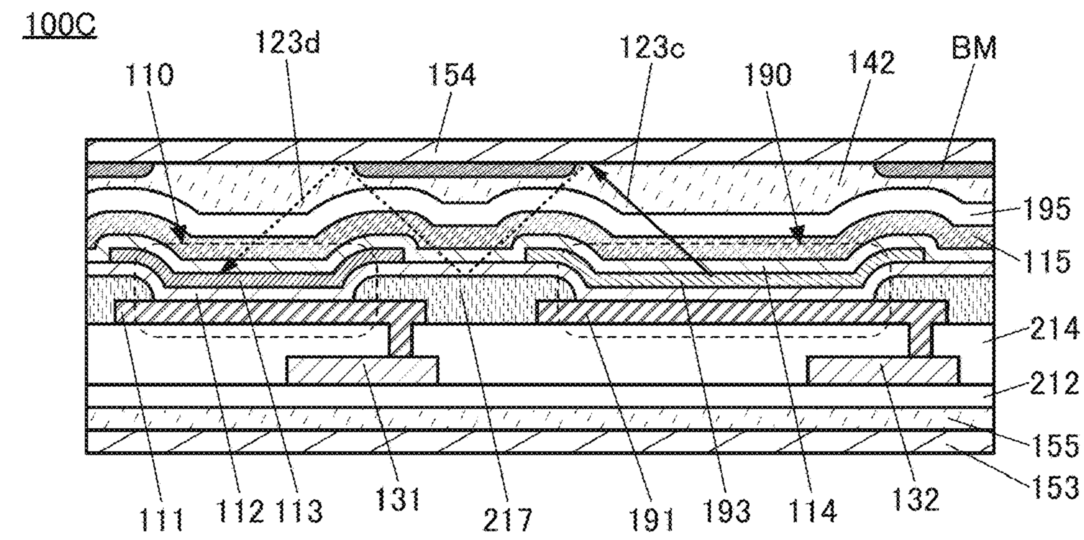

FIG. 8C is a schematic cross-sectional view of a display panel 100C. The display panel 100C differs from the display panel 100A in that the substrate 151, the substrate 152, and the partition 216 are not included and a substrate 153, a substrate 154, an adhesive layer 155, an insulating layer 212, and a partition 217 are included.

The substrate 153 and the insulating layer 212 are attached to each other with the adhesive layer 155. The substrate 154 and the protective layer 195 are attached to each other with the adhesive layer 142.

The display panel 100C is formed in such a manner that the insulating layer 212, the transistor 131, the transistor 132, the light-receiving element 110, the light-emitting element 190, and the like that are formed over a formation substrate are transferred onto the substrate 153. The substrate 153 and the substrate 154 are preferably flexible. Accordingly, the display panel 100C can be highly flexible. For example, a resin is preferably used for each of the substrate 153 and the substrate 154.

For each of the substrate 153 and the substrate 154, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 153 and the substrate 154.

For the substrate included in the display panel of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The partition 217 preferably absorbs light emitted from the light-emitting element. As the partition 217, a black matrix can be formed using a resin material containing pigment or dye, for example. Moreover, the partition 217 can be formed of a colored insulating layer by using a brown resist material.

Light 123*c* emitted from the light-emitting element 190 might be reflected by the substrate 152 and the partition 217 and reflected light 123*d* might be incident on the light-receiving element 110. In other cases, the light 123*c* passes through the partition 217 and is reflected by a transistor, a wiring, or the like, and thus reflected light is incident on the light-receiving element 110. When the partition 217 absorbs the light 123*c*, the reflected light 123*d* can be inhibited from being incident on the light-receiving element 110. Consequently, noise can be reduced, and the sensitivity of the sensor using the light-receiving element 110 can be increased.

The partition 217 preferably absorbs at least a wavelength of light that is detected by the light-receiving element 110. For example, in the case where the light-receiving element 110 detects red light emitted from the light-emitting element 190, the partition 217 preferably absorbs at least red light. For example, when the partition 217 includes a blue color filter, the partition 217 can absorb the red light 123*c* and thus the reflected light 123*d* can be inhibited from being incident on the light-receiving element 110.

Configuration Example 1-4

Although the light-emitting element and the light-receiving element include two common layers in the above example, one embodiment of the present invention is not limited thereto. Examples in which common layers have different structures are described below.

Figure 10A:
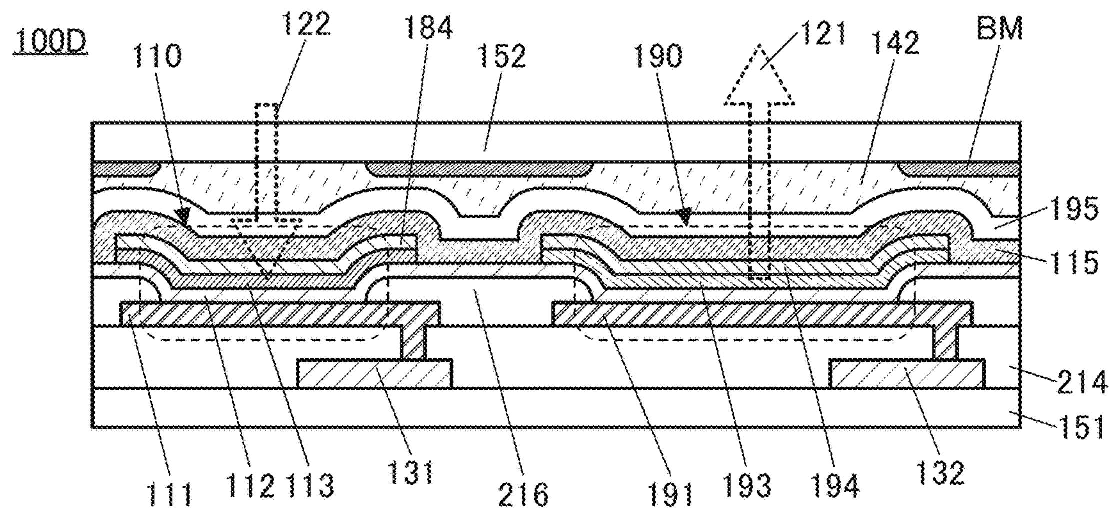
FIG. 10A to FIG. 10C are diagrams each showing a configuration example of a display panel.

FIG. 10A is a schematic cross-sectional view of the display panel 100D. The display panel 100D differs from the display panel 100A in that the common layer 114 is not included and a buffer layer 184 and a buffer layer 194 are included. The buffer layer 184 and the buffer layer 194 may each have a single-layer structure or a stacked-layer structure.

In the display panel 100D, the light-receiving element 110 includes the pixel electrode 111, the common layer 112, the active layer 113, the buffer layer 184, and the common electrode 115. In the display panel 100D, the light-emitting element 190 includes the pixel electrode 191, the common layer 112, the light-emitting layer 193, the buffer layer 194, and the common electrode 115.

In the display panel 100D, an example is shown in which the buffer layer 184 between the common electrode 115 and the active layer 113 and the buffer layer 194 between the common electrode 115 and the light-emitting layer 193 are formed separately. As the buffer layer 184 and the buffer layer 194, one or both of an electron-injection layer and an electron-transport layer can be formed, for example.

Figure 10B:
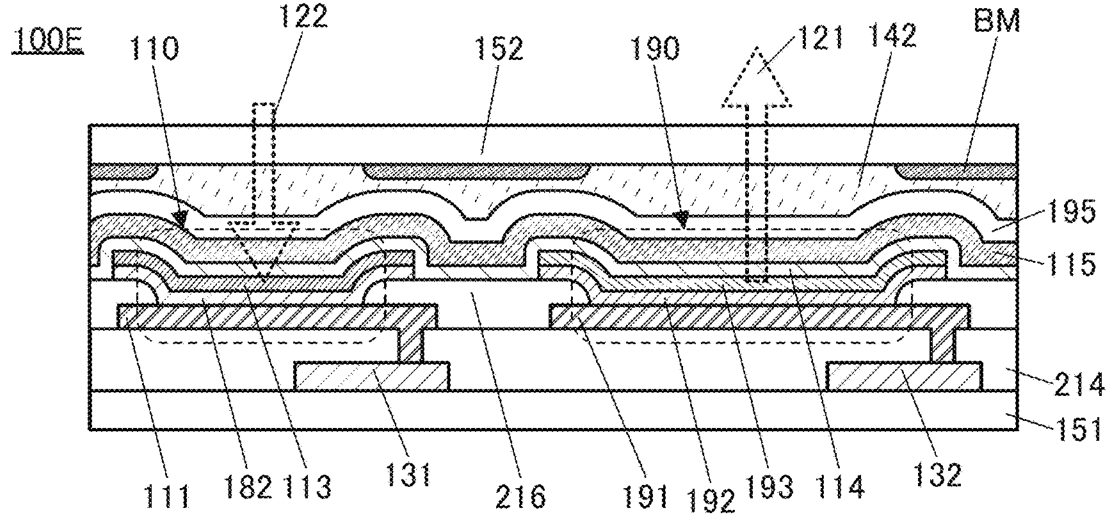

FIG. 10B is a schematic cross-sectional view of the display panel 100E. The display panel 100E differs from the display panel 100A in that the common layer 112 is not included and a buffer layer 182 and a buffer layer 192 are included. The buffer layer 182 and the buffer layer 192 may each have a single-layer structure or a stacked-layer structure.

In the display panel 100E, the light-receiving element 110 includes the pixel electrode 111, the buffer layer 182, the active layer 113, the common layer 114, and the common electrode 115. In the display panel 100E, the light-emitting element 190 includes the pixel electrode 191, the buffer layer 192, the light-emitting layer 193, the common layer 114, and the common electrode 115.

In the display panel 100E, an example is shown in which the buffer layer 182 between the pixel electrode 111 and the active layer 113 and the buffer layer 192 between the pixel electrode 191 and the light-emitting layer 193 are formed separately. As the buffer layer 182 and the buffer layer 192, one or both of a hole-injection layer and a hole-transport layer can be formed, for example.

Figure 10C:
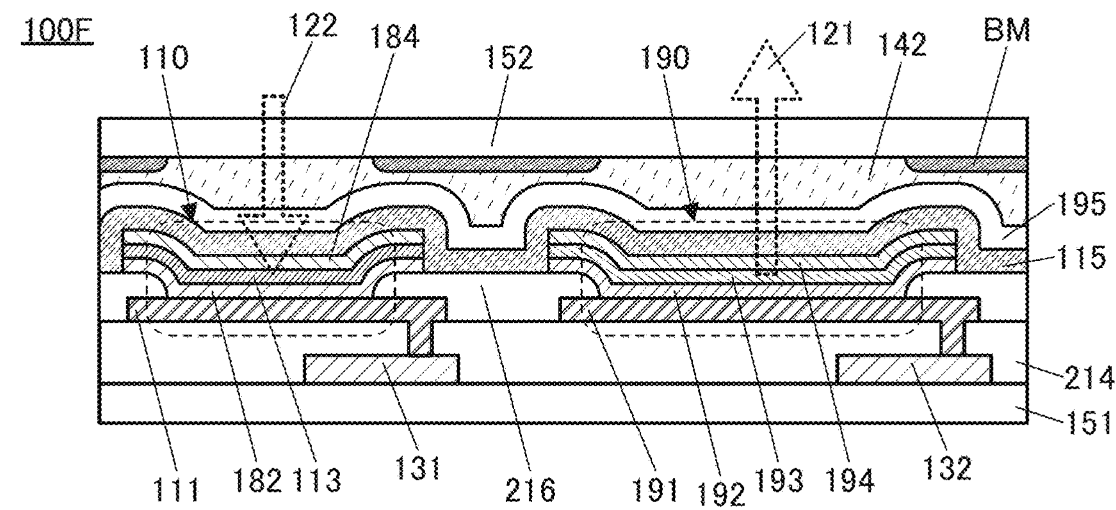

FIG. 10C is a schematic cross-sectional view of the display panel 100F. The display panel 100F differs from the display panel 100A in that the common layers 112 and 114 are not included and the buffer layers 182, 184, 192, and 194 are included.

In the display panel 100F, the light-receiving element 110 includes the pixel electrode 111, the buffer layer 182, the active layer 113, the buffer layer 184, and the common electrode 115. In the display panel 100F, the light-emitting element 190 includes the pixel electrode 191, the buffer layer 192, the light-emitting layer 193, the buffer layer 194, and the common electrode 115.

Another layer as well as the active layer 113 and the light-emitting layer 193 can be formed separately when the light-receiving element 110 and the light-emitting element 190 are manufactured.

In the example of the display panel 100F, in each of the light-receiving element 110 and the light-emitting element 190, a common layer is not provided between the pair of electrodes (the pixel electrode 111 or 191 and the common electrode 115). The light-receiving element 110 and the light-emitting element 190 included in the display panel 100F can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the buffer layer 184, the buffer layer 194, and the like.

Note that the manufacturing order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be formed. In contrast, the buffer layer 192, the light-emitting layer 193, and the buffer layer 194 may be formed before the buffer layer 182, the active layer 113, and the buffer layer 184 are deposited. Alternatively, the buffer layer 182, the buffer layer 192, the active layer 113, and the light-emitting layer 193 may be deposited in that order, for example.

Configuration Example 2 of Display Panel

More specific configuration examples of the display panel are described below.

Configuration Example 2-1

Figure 11:
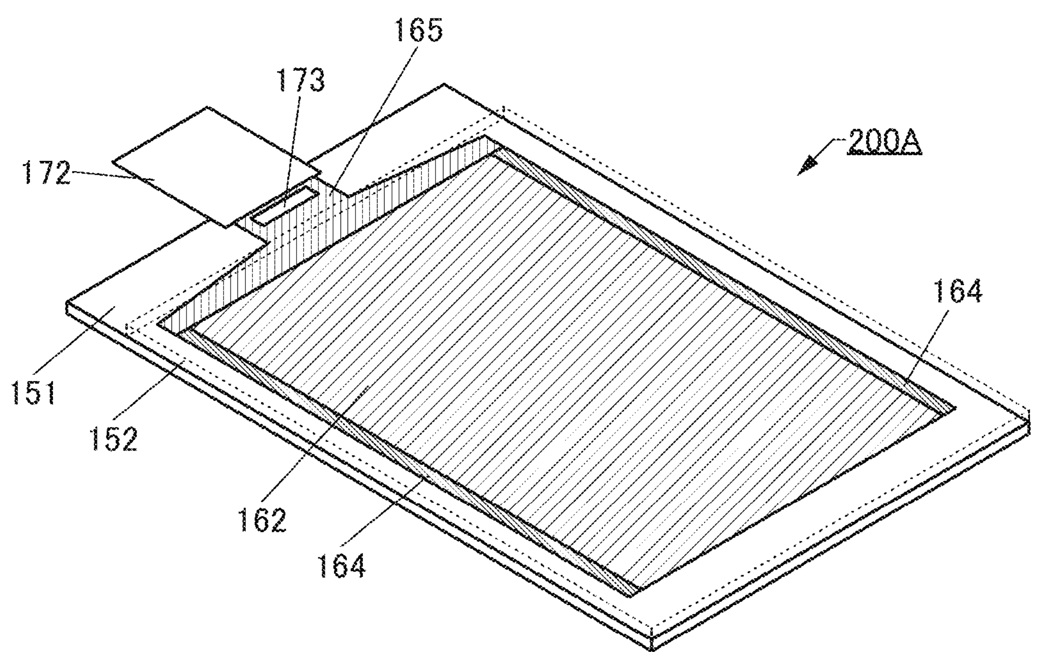
FIG. 11 is a diagram illustrating a configuration example of a display panel.

FIG. 11 is a perspective view of a display panel 200A.

In the display panel 200A, the substrate 151 and the substrate 152 are attached to each other. In FIG. 11, the substrate 152 is indicated by a dashed-dotted line.

The display panel 200A includes a display portion 162, circuits 164, a wiring 165, and the like. FIG. 11 shows an example in which an integrated circuit (IC) 173 and an FPC

172 are mounted on the display panel 200A. Thus, the structure shown in FIG. 11 can be regarded as a display module including the display panel 200A, the IC, and the FPC.

As the circuits 164, scan line driver circuits can be used.

The wiring 165 has a function of supplying a signal and power to the display portion 162 and the circuits 164. The signal and power are input to the wiring 165 from the outside through the FPC 172 or from the IC 173.

FIG. 11 shows an example in which the IC 173 is provided over the substrate 151 by a chip on glass (COG) method, a chip on film (COF) method, or the like. An IC including a scan line driver circuit, a signal line driver circuit, and the like can be used as the IC 173, for example. Note that the display panel 200A and the display module are not necessarily provided with an IC. The IC may be mounted on the FPC by a COF method or the like.

Figure 12:
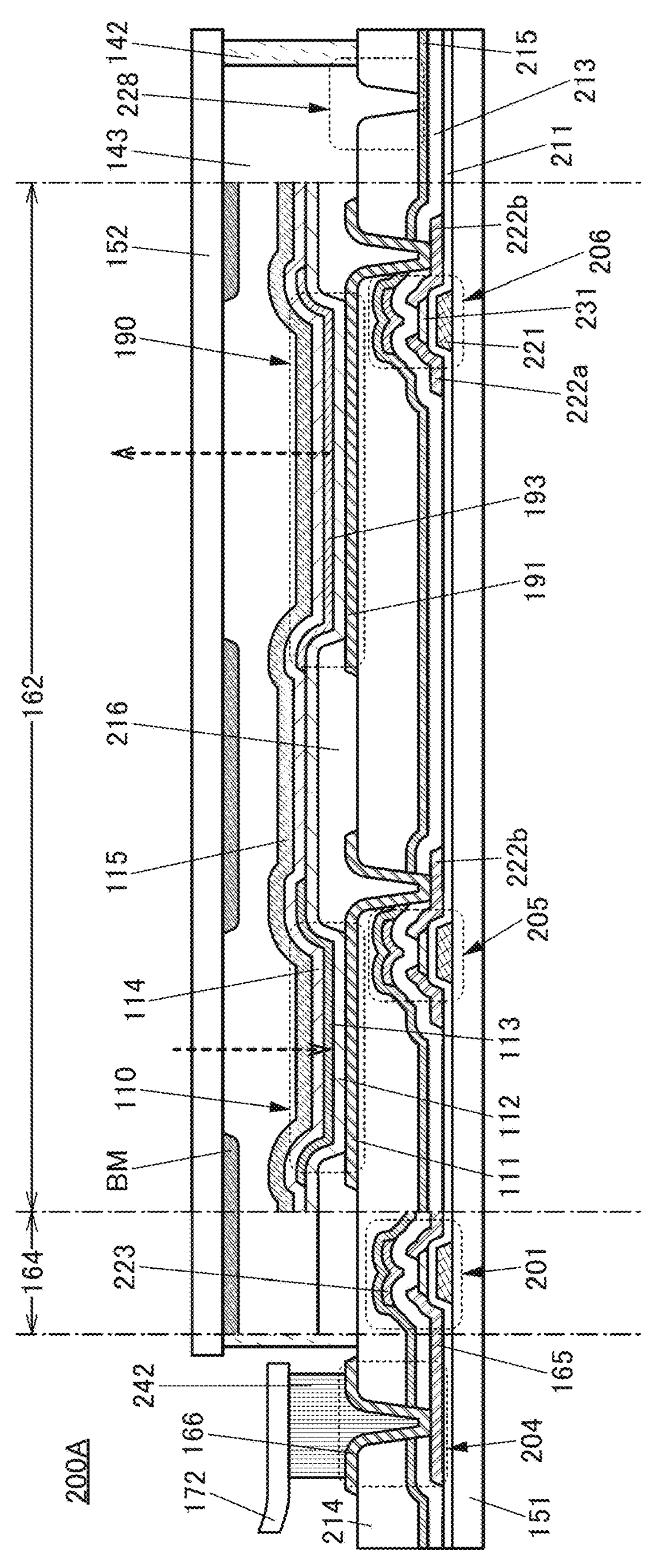
FIG. 12 is a diagram illustrating a configuration example of a display panel.

FIG. 12 shows an example of cross sections of part of a region including the FPC 172, part of a region including the circuit 164, part of a region including the display portion 162, and part of a region including an end portion of the display panel 200A shown in FIG. 11.

The display panel 200A shown in FIG. 12 includes a transistor 201, a transistor 205, a transistor 206, the light-emitting element 190, the light-receiving element 110, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190 and the light-receiving element 110. In FIG. 12, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in that order from the insulating layer 214 side. The pixel electrode 191 is connected to a conductive layer 222*b* included in the transistor 206 through an opening provided in the insulating layer 214. The transistor 206 has a function of controlling the driving of the light-emitting element 190. The end portion of the pixel electrode 191 is covered with the partition 216. The pixel electrode 191 contains a material that reflects visible light, and the common electrode 115 contains a material that transmits visible light.

The light-receiving element 110 has a stacked-layer structure in which the pixel electrode 111, the common layer 112, the active layer 113, the common layer 114, and the common electrode 115 are stacked in that order from the insulating layer 214 side. The pixel electrode 111 is electrically connected to the conductive layer 222*b* included in the transistor 205 through an opening provided in the insulating layer 214. The end portion of the pixel electrode 111 is covered with the partition 216. The pixel electrode 111 contains a material that reflects visible light, and the common electrode 115 contains a material that transmits visible light.

Light from the light-emitting element 190 is emitted toward the substrate 152. Light is incident on the light-receiving element 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving element 110 and the light-emitting element 190.

The light-receiving element 110 and the light-emitting element 190 can have common components except the active layer 113 and the light-emitting layer 193. Thus, the light-receiving element 110 can be incorporated in the display panel 100A without a significant increase in the number of manufacturing steps.

The light-blocking layer BM is provided on the surface of the substrate 152 on the substrate 151 side. The light-blocking layer BM has the opening at the position overlapping with the light-receiving element 110 and the opening at the position overlapping with the light-emitting element 190. Providing the light-blocking layer BM can control the range where the light-receiving element 110 detects light. Furthermore, providing the light-blocking layer BM can inhibit light from being directly incident on the light-receiving element 110 from the light-emitting element 190. Accordingly, a sensor with less noise and high sensitivity can be obtained.

The transistor 201, the transistor 205, and the transistor 206 are formed over the substrate 151. These transistors can be formed using the same material in the same step.

An insulating layer 211, an insulating layer 213, an insulating layer 215, and the insulating layer 214 are provided in that order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited, and may each be one, two, or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used for each of the insulating layers 211, 213, and 215. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Alternatively, a stack including two or more of the above insulating films may be used.

Here, an organic insulating film often has a lower barrier property than an inorganic insulating film. Therefore, the organic insulating film preferably has an opening in the vicinity of an end portion of the display panel 200A. This can inhibit entry of impurities from the end portion of the display panel 200A through the organic insulating film. Alternatively, the organic insulating film may be formed so that its end portion is positioned on the inner side compared to the end portion of the display panel 200A, to prevent the organic insulating film from being exposed at the end portion of the display panel 200A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 shown in FIG. 12, an opening is formed in the insulating layer 214. This can inhibit entry of impurities into the display portion 162 from the outside through the insulating layer 214 even when an organic insulating film is used as the insulating layer 214. Consequently, the reliability of the display panel 200A can be increased.

The transistors 201, 205, and 206 each include a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The transistors 201, 205, and 206 each have a structure in which the semiconductor layer where a channel is formed is positioned between two gates. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In—M—Zn oxide, the atomic ratio of In to M of a sputtering target used for depositing the In—M—Zn oxide is preferably 1 or more. The atomic ratio of metal elements in such a sputtering target is, for example, In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, or In:M:Zn=5:2:5.

A target containing a polycrystalline oxide is preferably used as the sputtering target, which facilitates formation of a semiconductor layer having crystallinity. Note that the atomic ratio in the semiconductor layer to be deposited varies by ±40% from any of the atomic ratios of the metal elements contained in the sputtering target. For example, in the case where the composition of a sputtering target used for the semiconductor layer is In:Ga:Zn=4:2:4.1 [atomic ratio], the composition of the semiconductor layer to be deposited is in the neighborhood of In:Ga:Zn=4:2:3 [atomic ratio] in some cases.

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. On a top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on an outer surface of the substrate 152. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water-repellent film suppressing the attachment of stain, a hard coat film inhibiting generation of a scratch caused by the use, an impact-absorbing layer, or the like may be provided on the outer surface of the substrate 152.

For each of the substrates 151 and 152, glass, quartz, ceramic, sapphire, a resin, or the like can be used. When each of the substrates 151 and 152 is formed using a flexible material, the flexibility of the display panel can be increased.

As the adhesive, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

The light-emitting element 190 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The light-emitting element 190 includes at least the light-emitting layer 193. In addition to the light-emitting layer 193, the light-emitting element 190 may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. For example, the common layer 112 preferably includes one or both of a hole-injection layer and a hole-transport layer. For example, the common layer 114 preferably includes one or both of an electron-transport layer and an electron-injection layer.

Either a low-molecular compound or a high-molecular compound can be used for the common layer 112, the light-emitting layer 193, and the common layer 114, and an inorganic compound may also be contained. The layers included in the common layer 112, the light-emitting layer 193, and the common layer 114 can be formed by any of the following methods, for example: an evaporation method (including a vacuum evaporation method), a transfer method, a printing method, an inkjet method, and a coating method.

The light-emitting layer 193 may contain an inorganic compound such as quantum dots.

The active layer 113 of the light-receiving element 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material contained in the active layer 113 include electron-accepting organic semiconductor materials such as fullerene (e.g., $C_{60}$ and $C_{70}$) and derivatives thereof. Examples of a p-type semiconductor material contained in the active layer 113 include electron-donating organic semiconductor materials such as copper(II) phthalocyanine (CuPc), tetraphenyldibenzoperiflanthene (DBP), and zinc phthalocyanine (ZnPc).

For example, the active layer 113 is preferably formed by co-evaporation of an n-type semiconductor and a p-type semiconductor.

As materials of a gate, a source, and a drain of a transistor, and conductive layers functioning as wirings and electrodes included in the display panel, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. These materials can also be used for conductive layers such as wirings and electrodes included in the display panel, and conductive layers (e.g., a conductive layer functioning as a pixel electrode or a common electrode) included in a display element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

Configuration Example 2-2

Figures 13A, 13B:
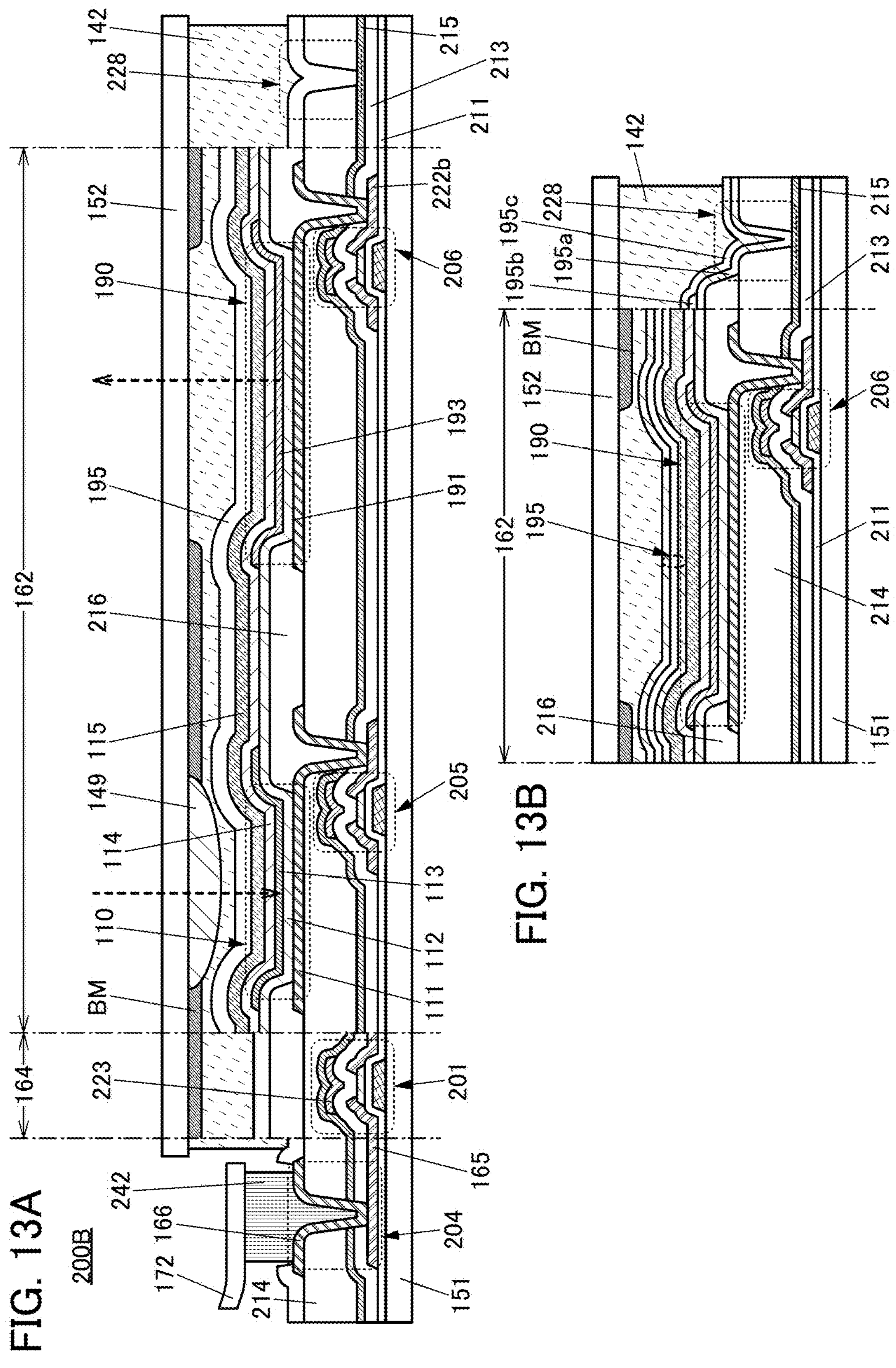
FIG. 13A and FIG. 13B are diagrams each showing a configuration example of a display panel.

FIG. 13A is a cross-sectional view of a display panel 200B. The display panel 200B differs from the display panel 200A mainly in that the lens 149 and the protective layer 195 are provided.

Providing the protective layer 195 covering the light-receiving element 110 and the light-emitting element 190 can inhibit diffusion of impurities such as water into the light-receiving element 110 and the light-emitting element 190, so that the reliability of the light-receiving element 110 and the light-emitting element 190 can be increased.

In the region 228 in the vicinity of an end portion of the display panel 200B, the insulating layer 215 and the protective layer 195 are preferably in contact with each other through an opening in the insulating layer 214. In particular, the inorganic insulating film included in the insulating layer 215 and an inorganic insulating film included in the protective layer 195 are preferably in contact with each other. Thus, diffusion of impurities from the outside into the display portion 162 through an organic insulating film can be inhibited. Accordingly, the reliability of the display panel 200B can be increased.

FIG. 13B shows an example in which the protective layer 195 has a three-layer structure. In FIG. 13B, the protective layer 195 includes an inorganic insulating layer 195*a* over the common electrode 115, an organic insulating layer 195*b* over the inorganic insulating layer 195*a*, and an inorganic insulating layer 195*c* over the organic insulating layer 195*b*.

An end portion of the inorganic insulating layer 195*a* and an end portion of the inorganic insulating layer 195*c* extend beyond an end portion of the organic insulating layer 195*b* and are in contact with each other. The inorganic insulating layer 195*a* is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, so that the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 on the substrate 151 side. The lens 149 has the convex surface on the substrate 151 side. It is preferable that the light-receiving region of the light-receiving element 110 overlap with the lens 149 and do not overlap with the light-emitting layer 193. Thus, the sensitivity and accuracy of the sensor using the light-receiving element 110 can be increased.

The lens 149 preferably has a refractive index of higher than or equal to 1.3 and lower than or equal to 2.5 with respect to the wavelength of light received by the light-receiving element 110. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, or the like can be used for the lens 149. Alternatively, a material containing a resin and nanoparticles of a material having a higher refractive index than the resin can be used for the lens 149. Titanium oxide, zirconium oxide, or the like can be used for the nanoparticles.

Alternatively, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, or the like can be used for the lens 149. Alternatively, zinc sulfide or the like can be used for the lens 149.

In the display panel 200B, the protective layer 195 and the substrate 152 are attached to each other with the adhesive layer 142. The adhesive layer 142 is provided to overlap with the light-receiving element 110 and the light-emitting element 190, and the display panel 200B has a solid sealing structure.

Configuration Example 2-3

Figures 14A, 14B:
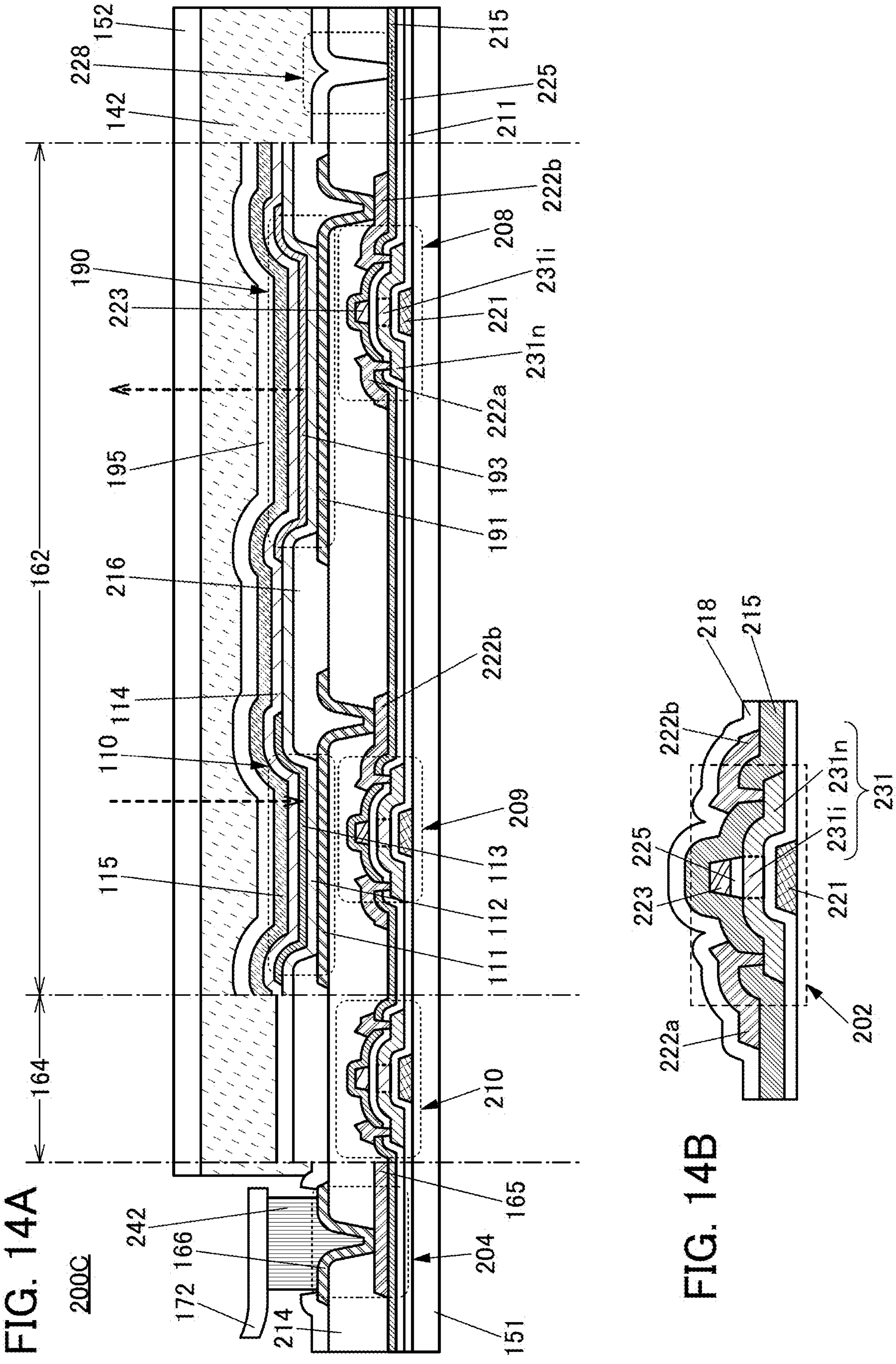
FIG. 14A and FIG. 14B are diagrams each showing a configuration example of a display panel.

FIG. 14A is a cross-sectional view of a display panel 200C. The display panel 200C differs from the display panel 200B mainly in the transistor structure and including neither the light-blocking layer BM nor the lens 149.

The display panel 200C includes a transistor 208, a transistor 209, and a transistor 210 over the substrate 151.

The transistors 208, 209, and 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other of the conductive layer 222*a* and the conductive layer 222*b* functions as a drain.

The pixel electrode 191 of the light-emitting element 190 is electrically connected to one of the pair of low-resistance regions 231*n* of the transistor 208 through the conductive layer 222*b*.

The pixel electrode 111 of the light-receiving element 110 is electrically connected to the other of the pair of low-resistance regions 231*n* of the transistor 209 through the conductive layer 222*b*.

FIG. 14A shows an example in which the insulating layer 225 covers a top surface and a side surface of the semiconductor layer. FIG. 14B shows an example of a transistor 202 in which the insulating layer 225 overlaps with the channel formation region 231*i* of the semiconductor layer 231 and does not overlap with the low-resistance regions 231*n*. The structure shown in FIG. 14B can be obtained by processing the insulating layer 225 using the conductive layer 223 as a mask, for example. In FIG. 14B, the insulating layer 215 is provided to cover the insulating layer 225 and the conductive layer 223, and the conductive layer 222*a* and the conductive layer 222*b* are connected to the low-resistance regions 231*n* through openings in the insulating layer 215. Furthermore, an insulating layer 218 covering the transistor may be provided.

Configuration Example 2-4

Figure 15:
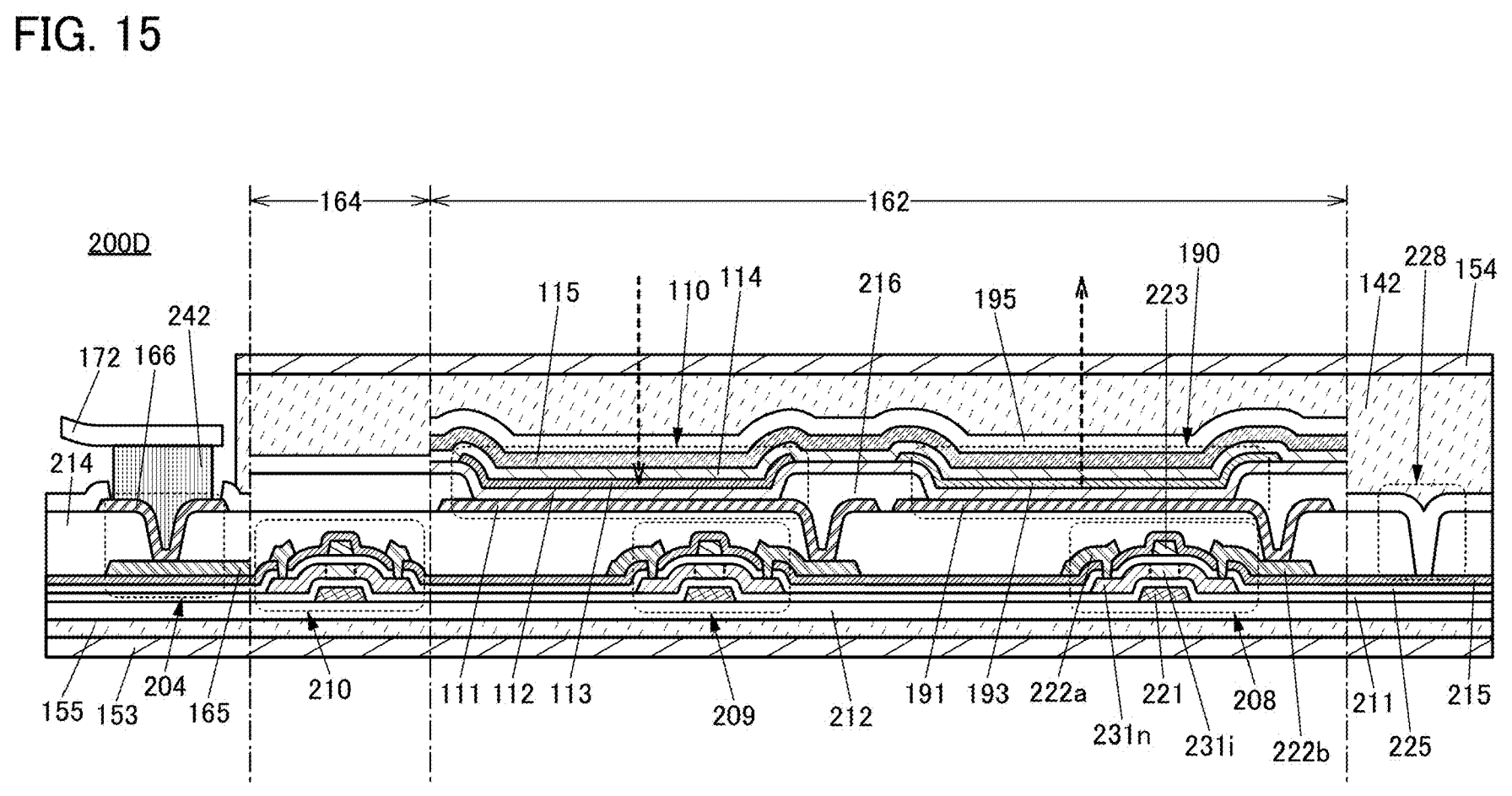

FIG. 15 is a cross-sectional view of a display panel 200D. The display panel 200D differs from the display panel 200C mainly in the substrate structure.

The display panel 200D includes neither the substrate 151 nor the substrate 152 and includes the substrate 153, the substrate 154, the adhesive layer 155, and the insulating layer 212.

The substrate 153 and the insulating layer 212 are attached to each other with the adhesive layer 155. The substrate 154 and the protective layer 195 are attached to each other with the adhesive layer 142.

The display panel 200D is formed in such a manner that the insulating layer 212, the transistor 208, the transistor 209, the light-receiving element 110, the light-emitting element 190, and the like that are formed over a formation substrate are transferred onto the substrate 153. The substrate 153 and the substrate 154 are preferably flexible. Accordingly, the display panel 200D can be highly flexible.

The inorganic insulating film that can be used for the insulating layer 211, the insulating layer 213, and the insulating layer 215 can be used for the insulating layer 212. Alternatively, a stacked film of an organic insulating film and an inorganic insulating film may be used for the insulating layer 212. In that case, a film on the transistor 209 side is preferably an inorganic insulating film.

The above is the description of the configuration examples of the display panel.

[Metal Oxide]

A metal oxide that can be used for the semiconductor layer is described below.

Note that in this specification and the like, a metal oxide containing nitrogen is also referred to as a metal oxide in some cases. In addition, a metal oxide containing nitrogen may be referred to as a metal oxynitride. For example, a metal oxide containing nitrogen, such as zinc oxynitride (ZnON), may be used for the semiconductor layer.

Note that the terms "CAAC (c-axis aligned crystal)" and "CAC (cloud-aligned composite)" might appear in this specification and the like. CAAC refers to an example of a crystal structure, and CAC refers to an example of a function or a material composition.

For example, a cloud-aligned composite oxide semiconductor (CAC-OS) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a semiconductor layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above conducting function, and the insulating regions have the above insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow through the component having a narrow gap. Furthermore, the component having a narrow gap complements the component having a wide gap, and carriers also flow through the component having a wide gap in conjunction with the component having a narrow gap. Therefore, in the case where the CAC-OS or the CAC-metal oxide is used for the channel formation region of the transistor, high current drive capability in an on state of the transistor, that is, high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of lattice arrangement changes between a region with regular lattice arrangement and another region with regular lattice arrangement in a region where the plurality of nanocrystals are connected.

The nanocrystal is basically a hexagon but is not always a regular hexagon and is a non-regular hexagon in some cases. Furthermore, pentagonal lattice arrangement, heptagonal lattice arrangement, and the like are included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of lattice arrangement. This is because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. Meanwhile, in the CAAC-OS, it can be said that a reduction in electron mobility due to the crystal grain boundary is less likely to occur because it is difficult to observe a clear crystal grain boundary. Furthermore, the mixing of impurities, formation of defects, or the like might decrease the crystallinity of the metal oxide; thus, it can also be said that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor, depending on the analysis method.

Note that indium-gallium-zinc oxide (hereinafter referred to as IGZO) that is a kind of metal oxide containing indium, gallium, and zinc has a stable structure in some cases when formed of the nanocrystals. In particular, IGZO crystals tend not to grow in the air and thus, a stable structure is obtained in some cases when IGZO is formed of smaller crystals (e.g., the nanocrystals) rather than larger crystals (here, crystals with a size of several millimeters or several centimeters).

The a-like OS is a metal oxide that has a structure between those of the nc-OS and the amorphous oxide semiconductor. The a-like OS includes a void or a low-density region. That is, the a-like OS has lower crystallinity than the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of deposition of the metal oxide film. However, to obtain a transistor having high field-effect mobility, the flow rate ratio of oxygen (the partial pressure of oxygen) at the time of deposition of the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably greater than or equal to 2 eV, further preferably greater than or equal to 2.5 eV, still further preferably greater than or equal to 3 eV. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, a vacuum evaporation method, or the like may be used.

The above is the description of the metal oxide.

At least part of this embodiment can be implemented in combination with any of the other embodiments described in this specification as appropriate.

Embodiment 3

In this embodiment, a display panel that can be used in the system of one embodiment of the present invention will be described with reference to FIG. 16A and FIG. 16B.

The display panel of one embodiment of the present invention includes first pixel circuits including a light-receiving element and second pixel circuits including a light-emitting element. The first pixel circuits and the second pixel circuits are each arranged in a matrix.

Figures 16A, 16B:
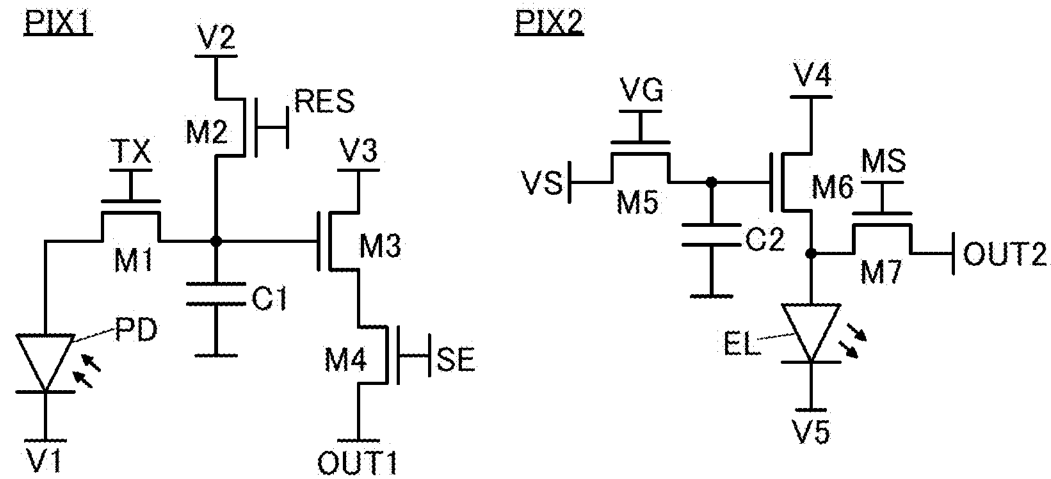
FIG. 16A and FIG. 16B are each a circuit diagram of a pixel circuit.

FIG. 16A shows an example of the first pixel circuit including a light-receiving element, and FIG. 16B shows an example of the second pixel circuit including a light-emitting element.

A pixel circuit PIX1 illustrated in FIG. 16A includes a light-receiving element PD, a transistor M1, a transistor M2, a transistor M3, a transistor M4, and a capacitor C1. Here, a photodiode is used as an example of the light-receiving element PD.

A cathode of the light-receiving element PD is electrically connected to a wiring V1 and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential is supplied to the wiring V1, the wiring V2, and the wiring V3. When the light-receiving element PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for outputting a signal corresponding to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 16B includes a light-emitting element EL, a transistor M5, a transistor M6, a transistor M7, and a capacitor C2. Here, a light-emitting diode is used as an example of the light-emitting element EL. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Note that in the display panel of this embodiment, the light-emitting element may be made to emit light in a pulsed manner so as to display an image. A reduction in the driving time of the light-emitting element can reduce power consumption of the display panel and suppress heat generation. An organic EL element is particularly preferable because of its favorable frequency characteristics. The frequency can be 1 kHz to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistor M1, the transistor M2, and the transistor M5 each of which is connected in series with the capacitor C1 or the capacitor C2. Moreover, the use of transistors including an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor including an oxide semiconductor may be used as at least one of the transistor M1 to the transistor M7, and transistors including silicon may be used as the other transistors.

Although the transistors are illustrated as n-channel transistors in FIG. 16A and FIG. 16B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided to overlap with the light-receiving element PD or the light-emitting element EL. Thus, the effective area of each pixel circuit can be reduced, and a high-definition light-receiving portion or display portion can be achieved.

At least part of this embodiment can be implemented in combination with any of the other embodiments described in this specification as appropriate.

REFERENCE NUMERALS

10: display system, 11: display device, 12, 12*a*, 12*b*: light-emitting apparatus, 15, 15*a*, 15*b*: light-receiving module, 16: control device, 20: display panel, 21: display unit, 22: pixel, 23, 23G, 23R, 23B: display element, 24: light-receiving element, 25, 26: driver circuit, 30: light-receiving unit, 31: light-receiving element, 41: control unit, 42, 42*a*, 42*b*, 43, 43*a*, 43*b*: driver unit, 51, 52: switch, 53, 54: light-emitting element, 55, 57: driver unit, 56: signal generation unit, 58, 59, 59*a*, 59*b*: irradiation region, 60, 60*a*, 60*b*: user, 61, 62, 63, 64, 66*a*, 66*b*, 67*a*, 67*b*, 68: object, 65: locus, 69*a*, 69*b*, 69*c*, 69*d*: icon This application is based on Japanese Patent Application Serial No. 2019-006581 filed on Jan. 18, 2019, the entire contents of which are hereby incorporated herein by reference.

The invention claimed is:

1. A display device comprising:

a display portion comprising:

a plurality of display elements emitting visible light; and a plurality of light-receiving elements receiving visible light, wherein the plurality of display elements are arranged in a matrix, wherein the plurality of light-receiving elements are arranged in a matrix, wherein the display element comprises a first pixel electrode, a first common layer, a light-emitting layer, a second common layer, and a common electrode, wherein the light-receiving element comprises a second pixel electrode, the first common layer, an active layer, the second common layer, and the common electrode, wherein the light-emitting layer comprises a first organic compound, wherein the active layer comprises a second organic compound, wherein the first pixel electrode and the second pixel electrode are provided on the same plane, wherein the common electrode comprises a region overlapping with the first pixel electrode with the first common layer, the light-emitting layer, and the second common layer therebetween and a region overlapping with the second pixel electrode with the first common layer, the active layer, and the second common layer therebetween, wherein the display device comprises a region where the first common layer and the second common layer are in contact with each other in a portion between the first pixel electrode and the second pixel electrode, wherein the first common layer is configured to transport or inject a hole, and wherein the second common layer is configured to transport or inject an electron.

2. A display device comprising:

a display portion comprising:

a plurality of display elements emitting visible light; and a plurality of light-receiving elements receiving visible light, wherein the plurality of display elements are arranged in a matrix, wherein the plurality of light-receiving elements are arranged in a matrix, wherein the display element comprises a first pixel electrode, a first common layer, a light-emitting layer, a second common layer, and a common electrode, wherein the light-receiving element comprises a second pixel electrode, the first common layer, an active layer, the second common layer, and the common electrode, wherein the light-emitting layer comprises a first organic compound, wherein the active layer comprises a second organic compound, wherein the first pixel electrode and the second pixel electrode are provided on the same plane, wherein the common electrode comprises a region overlapping with the first pixel electrode with the first common layer, the light-emitting layer, and the second common layer therebetween and a region overlapping with the second pixel electrode with the first common layer, the active layer, and the second common layer therebetween, wherein the first common layer is configured to transport or inject a hole, wherein the second common layer is configured to transport or inject an electron, wherein a partition is provided between the first pixel electrode and the second pixel electrode, and wherein the display device comprises a region where the first common layer and the second common layer are in contact with each other over the partition.

3. The display device according to claim 1, wherein the common electrode overlaps with the region where the first common layer and the second common layer are in contact with each other in the portion between the first pixel electrode and the second pixel electrode.

4. The display device according to claim 2, wherein the common electrode overlaps with the region where the first common layer and the second common layer are in contact with each other over the partition.

5. The display device according to claim 2, wherein the first common layer is in contact with upper surfaces of the first pixel electrode, the second pixel electrode, and the partition.

6. The display device according to claim 1, wherein the first pixel electrode and the second pixel electrode are each configured to reflect visible light.

7. The display device according to claim 2, wherein the first pixel electrode and the second pixel electrode are each configured to reflect visible light.

* * * * *